United States Patent [19]
Satake et al.

[11] Patent Number: 6,012,967
[45] Date of Patent: Jan. 11, 2000

[54] POLISHING METHOD AND POLISHING APPARATUS

[75] Inventors: Mitsunari Satake; Mikio Nishio; Tomoyasu Murakami, all of Osaka, Japan

[73] Assignee: Matsushita Electric Industrial Co., Ltd., Osaka, Japan

[21] Appl. No.: 08/979,693

[22] Filed: Nov. 26, 1997

[30] Foreign Application Priority Data

Nov. 29, 1996 [JP] Japan ................................ 8-318926

[51] Int. Cl.[7] ........................................................ B24B 1/00
[52] U.S. Cl. .............................. 451/36; 451/41; 451/6; 451/7; 451/488
[58] Field of Search ........................... 451/7, 53, 449, 451/488, 287, 288, 290, 41, 36, 6

[56] References Cited

U.S. PATENT DOCUMENTS

| | | |
|---|---|---|
| 4,450,652 | 5/1984 | Walsh ........................................ 51/131.4 |
| 4,471,579 | 9/1984 | Bovensiepen ........................... 51/165.73 |
| 5,643,050 | 7/1997 | Chen ............................................ 451/10 |
| 5,643,060 | 7/1997 | Sandhu et al. ............................. 451/285 |
| 5,722,875 | 3/1998 | Iwashita et al. ............................. 451/8 |
| 5,769,697 | 6/1998 | Nishio ........................................ 451/288 |
| 5,851,846 | 12/1998 | Matsui et al. .............................. 438/17 |

*Primary Examiner*—Timothy V. Eley
*Assistant Examiner*—Dung Van Nguyen
*Attorney, Agent, or Firm*—McDermott, Will & Emery

[57] ABSTRACT

A rotatable platen has a polishing pad adhered to the top surface thereof. A carrier for holding a substrate and a slurry supply pipe for supplying an abrasive slurry onto the near-center region of the polishing pad are provided above the polishing pad. Two lamps for partially irradiating the surface of the polishing pad with visible light or infrared light are provided at respective locations above the polishing pad and upstream of the carrier in the direction of rotation of the platen. Of the area of the polishing pad in contact with the substrate, a region closer to the center of rotation of the polishing pad and a region farther away therefrom are heated by the two lamps.

32 Claims, 28 Drawing Sheets

POLISHING METHOD AND POLISHING APPARATUS

The present invention relates to a polishing method and apparatus for use in a chemical mechanical polishing step of a semiconductor manufacturing process.

In recent years, a method of chemical mechanical polishing (CMP) has been used prevalently in the process of planarizing an insulating film deposited on a semiconductor substrate to be polished or in the process of forming embedded wiring. The CMP method entails the use of the following polishing apparatus.

Referring to FIG. 25, a polishing method and apparatus according to a conventional embodiment will be described. As shown in the drawing, a rotatable platen 11 composed of a flat rigid body has a polishing pad 12 adhered to the top surface thereof. A carrier 14 for holding a substrate 13 to be polished and a slurry supply pipe 16 for supplying an abrasive slurry 15 onto the near-center region of the polishing pad 12 are provided above the polishing pad 12.

In accordance with the polishing method, the platen 11 is rotated and the carrier 14 is lowered in level to press the substrate 13 to be polished against the polishing pad 12, while the abrasive slurry 15 containing abrasive grains is supplied onto the polishing pad 12.

As shown in FIG. 26, a depressed portion 17 is formed in the back face of the carrier 14 so that a backing pad 18 made of an elastic material is attached to the bottom face of the depressed portion 17. The carrier 14 presses the substrate 13 to be polished against the polishing pad 12 via the backing pad 18, whereby a target surface of the substrate 13 is polished at a uniform speed over the entire surface thereof. In this case, a polishing speed Pr at an arbitrary point on the substrate 13 is given by the following Preston equation $$Pr = kp \times Vt$$

(where p is applied pressure; V is a relative velocity; t is polishing time; and k is a coefficient).

However, it is difficult to hold the applied pressure p constant across the entire surface of the substrate 13, so that a uniform polishing speed Pr is not achieved over the entire surface of the substrate 13.

To achieve a uniform polishing speed, there has been proposed a method as seen in FIG. 27 wherein a sealing member 19 is provided along the periphery of the depressed portion 17 formed in the carrier 14, while pressing air is supplied through a pressing air supply path formed within a rotary shaft 14a of the carrier 14 into the depressed portion 17, so that the pressing air pushes the substrate 13 against the polishing pad 12. In accordance with the method, the applied pressure p can be held constant over the entire surface of the substrate 13, resulting in a uniform polishing speed Pr across the entire surface of the substrate 13.

When the present inventors actually polished the oxide film deposited on the substrate 13 by using the latter air pressing method, the polishing speed of the oxide film became more uniform and steady over the entire surface than in the case of using the former backing pad pressing method. When the platen 11 and the carrier 14 were rotated at the same speed and in the same direction, it was observed that the oxide film was polished at a more uniform speed across the entire surface because of the relative velocity which became constant in the foregoing Preston equation.

In the case of polishing a metal film made of tungsten or the like, however, even the air pressing method could not achieve a uniform polishing speed across the entire surface of the metal film. Specifically, a uniform polishing speed could not be achieved across the entire surface of the metal film even when the platen 11 and the carrier 14 were rotated in the same direction and at the same speed, while the relative velocity was held constant. In this case, the phenomenon of varying polishing speed was observed, in which the polishing speed is lower in the region of the target surface of the substrate 13 closer to or farther away from the center of rotation of the polishing pad 12 and higher in the midrange region. When a uniform polishing speed over the entire surface of the oxide film was examined in greater detail, the phenomenon of varying polishing speed was also observed, similarly to the metal film, though it was not so conspicuous as with the metal film.

SUMMARY OF THE INVENTION

It is therefore an object of the present invention to reduce variations in polishing speed at a target surface of a substrate to be polished.

During the polishing of tungsten, the present inventors measured the surface temperature of a polishing pad and found that the surface temperature was not uniform throughout the area of a polishing pad in contact with a substrate. Specifically, the surface temperature was relatively low in a region of the polishing pad closer to the center of rotation (first region) and in a region of the polishing pad farther away from the center of rotation (second region), while the surface temperature was relatively high in a third region of the polishing pad located between the first and second regions. The reason for this may be that the region of the polishing pad closer to or farther away from the center of rotation is in contact with the substrate for a shorter period of time, while the region of the polishing pad located between the regions closer to and farther away from the center of rotation is in contact with the substrate for a longer period of time.

FIG. 28(a) shows the relationship between the distance of a measurement point from the center of a substrate and the degree of deviation of a polishing speed in the case where a metal film of tungsten was polished by the air pressing method using an abrasive slurry containing iron nitrate as an oxidizing agent. The degree of deviation of a polishing speed is given by (*Polishing Speed at Measurement Point—Mean Polishing Speed*)/(*Mean Polishing Speed*). In this case, since the air pressing method applies an increased pressure to the peripheral portion of the substrate, the polishing speed was measured in a region 15 mm interior to the periphery of the substrate. As can be understood from FIG. 28(a), the polishing speed at the central portion of the substrate is higher than the mean polishing speed, while the polishing speed at the peripheral portion of the substrate is lower than the mean polishing speed.

FIG. 28(b) shows the relationship between the distance from a measurement point from the center of rotation of the polishing pad and a difference in the surface temperature of the polishing pad in the case where the metal film of tungsten was polished by the air pressing method, as described above. In this case, the difference in the surface temperature of the polishing pad represents a temperature difference between the measurement point and a surface portion of the polishing pad closest to the center of rotation of the polishing pad. Although the surface temperature of the polishing pad increases with time elapsed after the initiation of polishing (the rate of temperature increase is higher in the region B than in the regions A and C) and then becomes constant by the cooling effect of the platen (a relatively high constant speed is achieved in the region B and a relatively low constant speed is achieved in the regions A and C), the result of measurement shown in FIG. 28(b) was obtained during the period during which the surface temperature of the polishing pad was stable.

As can be understood from FIG. 28(b), the surface temperature of the contact area of the polishing pad with the substrate is higher in a region at an intermediate distance (region B) from the center of rotation of the polishing pad than in a region (region A) closer to the center of rotation of the polishing pad and in a region (region C) farther away from the center of rotation of the polishing pad. The difference in surface temperature was about 7° C. The reason for different surface temperatures across the polishing pad is that the rotation of the polishing pad keeps the regions A and C of the contact area of the polishing pad, which are closer to and farther away from the center of rotation of the polishing pad, in contact with the substrate during a shorter period of time, while the rotation of the polishing pad keeps the region B of the contact area of the polishing pad, which is at an intermediate distance from the center of rotation of the polishing pad, in contact with a longer period of time. This accumulates a larger amount of frictional heat in the region B and thereby greatly increases the surface temperature thereof. Although the surface temperature of the polishing pad is different between the regions A and C in FIG. 28(b), it is eventually evened since the substrate is rotating, i.e., the peripheral portion of the substrate is in contact with both the region A and the region C. Consequently, the degree of deviation of a polishing speed is symmetrical relative to the center of the substrate.

From the relationships shown in FIGS. 28(a) and 28(b), it will be appreciated that the region of the polishing pad having a higher surface temperature polishes the metal film at a higher speed and that the region of the polishing pad having a low surface temperature polishes the metal film at a lower speed. This is because a chemical reaction associated with polishing is accelerated as the surface temperature of the polishing pad is higher and hence the polishing speed is increased. Although it is generally assumed that the polishing of tungsten proceeds by oxidizing tungsten with iron nitrate, potassium iodate, or hydrogen peroxide and removing the resulting tungsten oxide with abrasive grains such as alumina particles, a higher temperature enhances the oxidizing ability and the polishing speed. It follows therefore that variations in the polishing speed of the metal film are reduced if variations in the surface temperature of the contact area of the polishing pad with the substrate are reduced.

Although the correlation between variations in the surface temperature of the polishing pad and variations in the polishing speed of the target surface is noticeable during the polishing of the metal film, it is also observed during the polishing of an oxide film.

The present inventors have found that variations in the polishing speed of a semiconductor substrate result from variations in the surface temperature of a polishing pad and achieved the present invention based on the finding. In a first aspect of the present invention, the region of the polishing pad in contact with the portion of the target surface being polished at a lower speed is heated or the region of the polishing pad in contact with the portion of the target surface being polished at a higher speed is cooled. In a second aspect of the present invention, of the area of the polishing pad in contact with the substrate, a region closer to or farther away from the center of rotation of the polishing pad is heated or a region at an intermediate distance from the center of rotation of the polishing pad is cooled. In a third aspect of the present invention, of the area of the polishing pad in contact with the substrate, a region having a lower surface temperature is heated or a region having a higher surface temperature is cooled.

A first polishing method according to the present invention comprises the step of polishing a target surface of a substrate to be polished by pressing the substrate against a surface of a polishing pad fixed on a rotating platen, while supplying an abrasive slurry onto the polishing pad, the method further comprising a polishing pad heating step of heating, of a contact area included in the surface of the polishing pad and brought into contact with the target surface with the rotation of the polishing pad to polish the target surface, a specified region in contact with a portion of the target surface being polished at a relatively low speed.

In accordance with the first polishing method, of the contact area included in the surface of the polishing pad, the specified region in contact with the portion of the target surface polished at a relatively low speed is heated, so that the target surface in contact with the heated region is polished at a higher speed than in the case where no heating is performed.

A second polishing method according to the present invention comprises the step of polishing a target surface of a substrate to be polished by pressing the substrate against a surface of a polishing pad fixed on a rotating platen, while supplying an abrasive slurry onto the polishing pad, the method further comprising a polishing pad heating step of heating, of a contact area included in the surface of the polishing pad and brought into contact with the target surface with the rotation of the polishing pad to polish the target surface, a specified region which is at least one of a first region closer to a center of rotation of the polishing pad and a second region farther away from the center of rotation of the polishing pad.

In accordance with the second polishing method, heating is performed with respect to, of the contact area included in the surface of the polishing pad, at least one of the first region closer to the center of rotation of the polishing pad and the second region farther away from the center of rotation of the polishing pad, i.e., the region having a relatively low surface temperature because of a shorter contact time during which it is kept in contact with the target surface due to its proximity to or distance from the center of rotation of the polishing pad, so that the target surface in contact with the heated region is polished at a higher speed than in the case where no heating is performed.

A third polishing method according to the present invention comprises the step of polishing a target surface of a substrate to be polished by pressing the substrate against a surface of a polishing pad fixed on a rotating platen, while supplying an abrasive slurry onto the polishing pad, the method further comprising a polishing pad heating step of measuring a surface temperature of a contact area included in the surface of the polishing pad and brought into contact with the target surface with the rotation of the polishing pad to polish the target surface and heating a specified region of the contact area having a relatively low surface temperature.

In accordance with the third polishing method, the surface temperature of the contact area included in the surface of the polishing pad is measured and the region having a relatively low surface temperature, i.e., the region of the polishing pad in contact with the portion of the target surface being polished at a relatively low speed is heated, so that the target surface in contact with the heated region is polished at a higher speed than in the case where no heating is performed.

In accordance with the first to third polishing methods, the target surface in contact with the heated region of the contact area included in the surface of the polishing pad is polished at a higher speed than in the case where no heating is performed, so that variations in the polishing speed of the target surface are reduced.

In particular, the first polishing method can reduce variations in polishing speed produced when the substrate is pressed against the polishing pad under nonuniform pressure and the second polishing method can reduce variations in polishing speed produced when the substrate is pressed against the polishing pad under uniform pressure, while the third polishing method can reduce variations in polishing speed resulting from different surface temperatures across the polishing pad.

In the third polishing method, if the measurement of the surface temperature of the polishing pad and the heating of the surface of the polishing pad are repeatedly performed, variations in polishing speed resulting from different surface temperatures across the polishing pad can further be reduced.

In the first to third polishing methods, the polishing pad heating step preferably includes the step of irradiating the specified region with light, an electromagnetic wave, or a laser beam and thereby heating the specified region. The arrangement facilitates the heating of the specified region.

In the first to third polishing methods, the polishing pad heating step preferably includes the step of spraying high-temperature gas onto the specified region and thereby heating the specified region. The arrangement facilitates the heating of the specified region.

In the first to third polishing methods, the polishing pad heating step includes the step of bringing a high-temperature solid member into contact with the specified region and thereby heating the specified region. The arrangement facilitates the adjustment of the range to be heated by adjusting the size of the bottom face of the high-temperature solid member.

In the first to third polishing methods, the polishing pad heating step preferably includes the step of pressing a pressing solid member against the specified region to generate frictional heat and thereby heating the specified region. The arrangement facilitates the adjustment of the range to be heated by adjusting the size of the bottom face of the pressing solid member.

In the first to third polishing methods, the polishing pad heating step preferably includes the step of supplying a high-temperature abrasive slurry to the specified region and thereby heating the specified region. By thus supplying the high-temperature abrasive slurry to the specified region, the specified region can easily be heated without the provision of additional equipment.

A fourth polishing method according to the present invention comprises the step of polishing a target surface of a substrate to be polished by pressing the substrate against a surface of a polishing pad fixed on a rotating platen, while supplying an abrasive slurry onto the polishing pad, the method further comprising a polishing pad cooling step of cooling, of a contact area included in the surface of the polishing pad and brought into contact with the target surface with the rotation of the polishing pad to polish the target surface, a specified region in contact with a portion of the target surface being polished at a relatively high speed.

In accordance with the fourth polishing methods, of the contact area included in the surface of the polishing pad, the specified region of the polishing pad in contact with the portion of the target surface being polished at a relatively high speed is cooled, so that the target surface in contact with the cooled region is polished at a lower speed than in the case where no cooling is performed.

A fifth polishing method according to the present invention comprises the step of polishing a target surface of a substrate to be polished by pressing the substrate against a surface of a polishing pad fixed on a rotating platen, while supplying an abrasive slurry onto the polishing pad, the method further comprising a polishing pad cooling step of cooling, of a contact area included in the surface of the polishing pad and brought into contact with the target surface with the rotation of the polishing pad to polish the target surface, a third region located between a first region closer to a center of rotation of the polishing pad and a second region farther away from the center of rotation of the polishing pad.

In accordance with the fifth polishing method, cooling is performed with respect to, of the contact area included in the surface of the polishing pad, the region of the polishing pad having an increased surface temperature because of a longer contact time during which it is kept in contact with the target surface due to its location between the first region closer to the center of rotation of the polishing pad and the second region farther away from the center of rotation of the polishing pad, i.e., at an intermediate distance from the center of rotation of the polishing pad, so that the target surface in contact with the cooled region is polished at a lower speed than in the case where no cooling is performed.

A sixth polishing method according to the present invention comprises the step of polishing a target surface of a substrate to be polished by pressing the substrate against a surface of a polishing pad fixed on a rotating platen, while supplying an abrasive slurry onto the polishing pad, the method further comprising a polishing pad cooling step of measuring a surface temperature of a contact area included in the surface of the polishing pad and brought into contact with the target surface with the rotation of the polishing pad to polish the target surface and cooling a region of the contact area having a relatively high surface temperature.

In accordance with the sixth polishing method, the surface temperature of the contact area included in the surface of the polishing pad is measured and the region of the polishing pad having a relatively high surface temperature, i.e., the region of the polishing pad in contact with the portion of the target surface being polished at a relatively high speed is cooled, so that the target surface in contact with the cooled region is polished at a lower speed than in the case where no cooling is performed.

In accordance with the fourth to sixth polishing methods, the target surface in contact with the cooled region of the contact area included in the surface of the polishing pad is polished at a lower speed than in the case where no cooling is performed, so that variations in the polishing speed of the target surface are reduced.

In particular, the fourth polishing method can reduce variations in polishing speed produced when the substrate is pressed against the polishing pad under nonuniform pressure and the fifth polishing method can reduce variations in polishing speed when the substrate is pressed against the polishing pad under uniform pressure, while the sixth polishing method can reduce variations in polishing speed resulting from different surface temperatures across the polishing pad.

In the sixth polishing method, if the measurement of the surface temperature of the polishing pad and the cooling of the surface of the polishing pad are repeatedly performed, variations in the polishing speed resulting from different surface temperatures across the polishing pad can further be reduced.

In the fourth to sixth polishing methods, the polishing pad cooling step preferably includes the step of spraying low-temperature gas onto the specified region and thereby cooling the specified region. The arrangement facilitates the cooling of the specified region.

In the fourth to sixth polishing methods, the polishing pad cooling step preferably includes the step of bringing a low-temperature solid member into contact with the specified region and thereby cooling the specified region. The arrangement facilitates the adjustment of the range to be cooled by adjusting the size of the bottom face of the low-temperature solid member.

In the fourth to sixth polishing methods, the polishing pad cooling step preferably includes the step of supplying a low-temperature abrasive slurry to the specified region and thereby cooling the specified region. The arrangement allows easy cooling of the specified region without the provision of additional equipment.

A first polishing apparatus according to the present invention comprises: a rotatable platen; a polishing pad fixed on the platen; a slurry supply pipe for supplying an abrasive slurry onto the polishing pad; substrate holding means for holding a substrate to be polished such that the substrate is movable toward and away from polishing pad with a target surface of the substrate being opposed to a surface of the polishing pad; and polishing pad heating means for heating a specified region of a contact area included in the surface of the polishing pad and brought in contact with the target surface with the rotation of the polishing pad, the specified region being in contact with a portion of the target surface being polished at a relatively low speed.

In the first polishing apparatus, the polishing pad heating means heats, of the contact area included in the surface of the polishing pad, the specified region of the polishing pad in contact with the portion of the target surface being polished at a relatively low speed, so that the target surface in contact with the heated region is polished at a higher speed than in the case where no heating is performed.

A second polishing apparatus according to the present invention comprises: a rotatable platen; a polishing pad fixed on the platen; a slurry supply pipe for supplying an abrasive slurry onto the polishing pad; substrate holding means for holding a substrate to be polished such that the substrate is movable toward and away from the polishing pad with a target surface of the substrate being opposed to a surface of the polishing pad; and polishing pad heating means for heating a specified region of a contact area included in the surface of the polishing pad and brought in contact with the target surface with the rotation of the polishing pad, the specified region being at least one of a first region closer to a center of rotation of the polishing pad and a second region farther away from the center of rotation of the polishing pad.

In the second polishing apparatus, the polishing pad heating means heats, of the contact area included in the surface of the polishing pad, at least one of the first region closer to the center of rotation of the polishing pad and the second region farther away from the center of rotation of the polishing pad, i.e., the region having a relatively low surface temperature because of a shorter contact time during which it is kept in contact with the target surface due to its proximity to or distance from the center of rotation of the polishing pad, so that the target surface in contact with the heated region is polished at a higher speed than in the case where no heating is performed.

A third polishing apparatus according to the present invention comprises: a rotatable platen; a polishing pad fixed on the platen; a slurry supply pipe for supplying an abrasive slurry onto the polishing pad; substrate holding means for holding a substrate to be polished such that the substrate is movable toward and away from the polishing pad with a target surface of the substrate being opposed to a surface of the polishing pad; temperature measuring means for measuring a surface temperature of a contact area included in the surface of the polishing pad and brought into contact with the target surface with the rotation of the polishing pad; and polishing pad heating means for heating a specified region of the contact area in which the surface temperature of the polishing pad measured by the temperature measuring means is relatively low.

In the third polishing apparatus, the temperature measuring means measures the surface temperature of the contact area included in the polishing pad and the polishing pad heating means heats the region having a relatively low surface temperature, i.e., the region of the polishing pad in contact with the portion of the target surface being polished at a relatively low speed, so that the target surface in contact with the heated region is polished at a higher speed than in the case where no heating is performed.

In the first to third polishing apparatus, the target surface in contact with the heated region of the contact area included in the surface of the polishing pad is polished at a higher speed than in the case where no heating is performed, so that variations in the polishing speed of the target surface are reduced.

In particular, the first polishing apparatus can reduce variations in polishing speed produced when the substrate is pressed against the polishing pad under nonuniform pressure and the second polishing apparatus can reduce variations in polishing speed when the substrate is pressed against the polishing pad under uniform pressure, while the third polishing apparatus can reduce variations in polishing speed resulting from different surface temperatures across the polishing pad.

In the first to third polishing apparatus, the polishing pad heating means preferably includes a plurality of polishing pad heating means arranged in a radial direction of the polishing pad. The arrangement enables elaborate heating of the specified region, so that variations in polishing speed are further reduced.

In the first to third polishing apparatus, the polishing pad heating means is preferably movable in a radial direction of the polishing pad. The arrangement enables elaborate heating of the specified region, so that variations in polishing speed are further reduced.

In the first to third polishing apparatus, the polishing pad heating means preferably heats a region of the contact area of the polishing pad to be subsequently brought in contact with the target surface with the rotation of the polishing pad. In the arrangement, the heated region is kept in contact with the target surface till the temperature is reduced so that the effect of heating is exerted positively.

In the first to third polishing apparatus, the polishing pad heating means is preferably an energy supplying means for supplying energy composed of light, an electromagnetic wave, or a laser beam to the specified region. The arrangement facilitates the heating of the specified region.

In the first to third polishing apparatus, the polishing pad heating means is preferably a high-temperature-gas spraying means for spraying high-temperature gas onto the specified region. The arrangement facilitates the heating of the specified region.

In the first to third polishing apparatus, the polishing pad heating means is preferably a high-temperature-solid-member contacting means for bringing a high-temperature solid member into contact with the specified region. The arrangement facilitates the adjustment of the range to be heated by adjusting the size of the bottom face of the high-temperature solid member.

When the polishing pad heating means is a high-temperature-solid-member contacting means in the first to third polishing apparatus, a heating wire is preferably provided within the high-temperature solid member.

When the polishing pad heating means is a high-temperature-solid-member contacting means in the first to third polishing apparatus, piping for allowing the passage of a high-temperature fluid therethrough is preferably provided within the high-temperature solid member. The arrangement rapidly increases the temperature of the solid member and facilitates the adjustment of the temperature of the solid member.

When the polishing pad heating means is a high-temperature-solid-member contacting means in the first to third polishing apparatus, the high-temperature solid member is preferably composed of metal and a surface portion of the high-temperature solid member in direct contact with the polishing pad is preferably formed with a coating layer composed of polytetrafluoroethylene. The arrangement prevents the high-temperature solid member from being corroded by an acidic or alkaline abrasive slurry.

In the first to third polishing apparatus, the polishing pad heating means is preferably a pressing-solid-member pressing means for pressing a pressing solid member against the specified region and thereby generating frictional heat. The arrangement facilitates the adjustment of the range to be heated by adjusting the size of the bottom face of the pressing solid member.

When the polishing pad heating means is a pressing-solid-member pressing means in the first to third polishing apparatus, the pressing-solid-member pressing means preferably presses the pressing solid member against the specified region by using a pressing fluid. The arrangement allows easy control of the pressure exerted by the pressing solid member or the degree of heating performed with respect to the polishing pad.

When the polishing pad heating means is a pressing-solid-member pressing means in the first to third polishing apparatus, a surface portion of the pressing solid member in direct contact with the polishing pad is preferably formed with a coating layer composed of polytetrafluoroethylene. The arrangement prevents the pressing solid member from being corroded by an acidic or alkaline abrasive slurry.

When the polishing pad heating means is a pressing-solid-member pressing means in the first to third polishing apparatus, a portion of the pressing solid member in direct contact with the polishing pad is preferably formed of the same material as a target film to be polished deposited on the substrate. The arrangement prevents powder resulting from the grating of the pressing solid member from exerting an adverse effect.

In the first to third polishing apparatus, the polishing pad heating means is preferably high-temperature-slurry supplying means for supplying a high-temperature abrasive slurry from the slurry supply pipe to the specified region. The arrangement allows easy heating without the provision of additional equipment.

In the second polishing apparatus, the polishing pad heating means is preferably a high-temperature-slurry supply pipe provided separately and distinctly from the slurry supply pipe to supply a high-temperature abrasive slurry to the second region. In the arrangement, the abrasive slurry is supplied from the normal slurry supply pipe to the first region, so that the abrasive slurry is supplied to the entire surface of the polishing pad.

The third polishing apparatus preferably further comprises a heating means control unit for reducing the degree of heating by the polishing pad heating means when the surface temperature of the polishing pad measured by the temperature measuring means is tending to increase, while increasing the degree of heating by the polishing pad heating means when the surface temperature of the polishing pad measured by the temperature measuring means is tending to decrease. As polishing proceeds, the surface temperature of the polishing pad steadily increases to reach a saturation point. After the saturation point is reached, the degree of heating by the polishing pad heating means is controlled to provide a more uniform surface temperature over the polishing pad and thereby further reduce variations in polishing speed.

When the third polishing apparatus comprises a heating means control unit, the polishing pad heating means is preferably a energy supplying means for supplying energy composed of an electromagnetic wave or a laser beam and the heating means control unit preferably controls a voltage or current supplied to the energy supplying means, the distance of the energy supplying means from the surface of the polishing pad, or the time during which the energy supplying means supplies energy. The arrangement controls the degree of heating performed with respect to the polishing pad.

When the third polishing apparatus comprises a heating means control unit, the polishing pad heating means is preferably a high-temperature-gas spraying means for spraying high-temperature gas onto the specified region and the heating means control unit preferably controls the amount of the high-temperature gas supplied to the high-temperature-gas spraying means, the temperature of the high-temperature gas supplied to the high-temperature-gas spraying means, the distance of the high-temperature-gas spraying means from the surface of the polishing pad, or the time during which the high-temperature-gas spraying means sprays the high-temperature gas. The arrangement controls the degree of heating performed with respect to the polishing pad.

When the third polishing apparatus comprises a heating means control unit, the polishing pad heating means is preferably a high-temperature-solid-member contacting means for bringing a high-temperature solid member internally provided with a heating wire to the specified region and the heating means control unit preferably controls the magnitude of a voltage or current applied to the heating wire within the high-temperature solid member or the application time. The arrangement controls the degree of heating performed with respect to the polishing pad.

When the third polishing apparatus comprises a heating means control unit, the polishing pad heating means is preferably a high-temperature-solid-member contacting means for bringing a high-temperature solid member internally provided with piping for allowing the passage of a high-temperature fluid therethrough to the specified region and the heating means control unit preferably controls the temperature or flow rate of the high-temperature fluid supplied to the piping. The arrangement controls the degree of heating performed with respect to the polishing pad.

A fourth polishing apparatus according to the present invention comprises: a rotatable platen; a polishing pad fixed on the platen; a slurry supply pipe for supplying an abrasive slurry onto the polishing pad; substrate holding means for holding a substrate to be polished such that the substrate is movable toward and away from the polishing pad with a target surface of the substrate being opposed to a surface of the polishing pad; and polishing pad cooling means for cooling a specified region of a contact area included in the surface of the polishing pad and brought in contact with the target surface with the rotation of the polishing pad, the specified region being in contact with a portion of the target surface being polished at a relatively high speed.

In the fourth polishing apparatus, of the contact area included in the surface of the polishing pad, the specified region of the polishing pad in contact with the portion of the target surface being polished at a relatively high speed is cooled by the polishing pad cooling means, so that the target surface in contact with the cooled region is polished at a lower speed than in the case where no cooling is performed.

A fifth polishing apparatus according to the present invention comprises: a rotatable platen; a polishing pad fixed on the platen; a slurry supply pipe for supplying an abrasive slurry onto the polishing pad; substrate holding means for holding a substrate to be polished such that the substrate is movable toward and away from the polishing pad with a target surface of the substrate being opposed to a surface of the polishing pad; and polishing pad cooling means for cooling a specified region of a contact area included in the surface of the polishing pad and brought in contact with the target surface with the rotation of the polishing pad, the specified region being a third region located between a first region closer to a center of rotation of the polishing pad and a second region farther away from the center of rotation of the polishing pad.

In the fifth polishing apparatus, the polishing pad cooling means cools, of the contact area included in the surface of the polishing pad, the region of the polishing pad having an increased surface temperature because of a longer contact time during which it is kept in contact with the target surface due to its location between the first region closer to the center of rotation of the polishing pad and the second region farther away from the center of rotation of the polishing pad, i.e., at an intermediate distance from the center of rotation of the polishing pad, so that the target surface in contact with the cooled region is polished at a lower speed than in the case where no cooling is performed.

A sixth polishing apparatus according to the present invention comprises: a rotatable platen; a polishing pad fixed on the platen; a slurry supply pipe for supplying an abrasive slurry onto the polishing pad; substrate holding means for holding a substrate to be polished such that the substrate is movable toward and away from the polishing pad with a target surface of the substrate being opposed to a surface of the polishing pad; temperature measuring means for measuring a surface temperature of a contact area included in the surface of the polishing pad and brought into contact with the target surface with the rotation of the polishing pad; and polishing pad cooling means for cooling a specified region of the contact area in which the surface temperature of the polishing pad measured by the temperature measuring means is relatively high.

In the sixth polishing apparatus, the temperature measuring means measures the surface temperature of the contact area included in the surface of the polishing pad and the polishing pad cooling means cools the region of the polishing pad having a relatively high surface temperature, i.e., the region of the polishing pad in contact with the portion of the target surface being polished at a relatively high speed, so that the target surface in contact with the cooled region is polished at a lower speed than in the case where no cooling is performed.

In the fourth to sixth polishing apparatus, the target surface in contact with the cooled region of the contact area included in the surface of the polishing pad is polished at a lower speed than in the case where no cooling is performed, so that variations in the polishing speed of the target surface are reduced.

In particular, the fourth polishing apparatus can reduce variations in polishing speed produced when the substrate is pressed against the polishing pad under nonuniform pressure and the fifth polishing apparatus can reduce variations in polishing speed when the substrate is pressed against the polishing pad under uniform pressure, while the sixth polishing apparatus can reduce variations in polishing speed resulting from different surface temperatures across the polishing pad.

In the fourth to sixth polishing apparatus, the polishing pad cooling means is preferably movable in a radial direction of the polishing pad. The arrangement enables elaborate cooling of the specified region, so that variations in polishing speed are further reduced.

In the fourth to sixth polishing apparatus, the polishing pad cooling means preferably cools a region of the contact area of the polishing pad to be subsequently brought in contact with the target surface with the rotation of the polishing pad. In the arrangement, the cooled region is kept in contact with the target surface till the temperature is increased so that the effect of cooling is exerted positively.

In the fourth to sixth polishing apparatus, the polishing pad cooling means is preferably a low-temperature-gas spraying means for spraying low-temperature gas onto the specified region. The arrangement facilitates the cooling of the specified region.

In the fourth to sixth polishing apparatus, the polishing pad cooling means is preferably a low-temperature-solid-member contacting means for bringing a low-temperature solid member into contact with the specified region. The arrangement facilitates the adjustment of the range to be cooled by adjusting the size of the bottom face of the low-temperature solid member.

When the polishing pad cooling means is a low-temperature-solid-member contacting means in the fourth to sixth polishing apparatus, piping for allowing the passage of a low-temperature fluid therethrough is preferably provided within the low-temperature solid member. The arrangement rapidly decreases the temperature of the solid member and facilitates the adjustment of the temperature of the solid member.

When the polishing pad cooling means is a low-temperature-solid-member contacting means in the fourth to sixth polishing apparatus, the low-temperature solid member is preferably composed of metal and a surface portion of the low-temperature solid member in direct contact with the polishing pad is preferably formed with a coating layer composed of polytetrafluoroethylene. The arrangement prevents the low-temperature solid member from being corroded by an acidic or alkaline abrasive slurry.

In the fourth to sixth polishing apparatus, the polishing pad cooling means is preferably a low-temperature-slurry supplying means for supplying a low-temperature abrasive slurry from the slurry supply pipe to the specified region.

The arrangement allows easy cooling without the provision of additional equipment.

In the fifth polishing apparatus, the polishing pad cooling means is preferably a low-temperature-slurry supply pipe provided separately and distinctly from the slurry supply pipe to supply a low-temperature abrasive slurry to the third region. In the arrangement, the abrasive slurry is supplied from the normal slurry supply pipe to the first region, so that the abrasive slurry is supplied to the entire surface of the polishing pad.

The sixth polishing apparatus preferably further comprises a cooling means control unit for reducing the degree of cooling by the polishing pad cooling means when the surface temperature of the polishing pad measured by the temperature measuring means is tending to decrease, while increasing the degree of cooling by the polishing pad cooling means when the surface temperature of the polishing pad measured by the temperature measuring means is tending to increase. As polishing proceeds, the surface temperature of the polishing pad steadily decreases to reach a saturation point. After the saturation point is reached, the degree of cooling by the polishing pad cooling means is controlled to provide a more uniform temperature over the polishing pad and thereby further reduce variations in polishing speed.

When the sixth polishing apparatus comprises a cooling means control unit, the polishing pad cooling means is preferably a low-temperature-gas spraying means for spraying low-temperature gas onto the specified region and the cooling means control unit preferably controls the amount of the low-temperature gas supplied to the low-temperature-gas supplying means, the temperature of the low-temperature gas supplied to the low-temperature-gas spraying means, the distance of the low-temperature-gas spraying means from the surface of the polishing pad, or the time during which the low-temperature-gas supplying means sprays the low-temperature gas. The arrangement controls the degree of cooling performed with respect to the polishing pad.

When the sixth polishing apparatus comprises a cooling means control unit, the polishing pad cooling means is preferably a low-temperature-solid-member contacting means for bringing a low-temperature solid member internally provided with piping for allowing the passage of a low-temperature fluid therethrough to the specified region and the cooling means control unit preferably controls the temperature or flow rate of the low-temperature fluid supplied to the piping. The arrangement controls the degree of cooling performed with respect to the polishing pad.

In the third or sixth polishing apparatus, the temperature measuring means is preferably a plurality of radiation thermometers arranged in a radial direction of the polishing pad, each of the radiation thermometers measuring the surface temperature at a point on the polishing pad without contact therewith. The arrangement allows proper measurement of the surface temperature of the polishing pad.

In the third or sixth polishing apparatus, the temperature measuring means is preferably a temperature measuring camera for measuring the surface temperature of the polishing pad in two dimensions without contact therewith. The arrangement allows proper measurement of the surface temperature of the polishing pad.

In the third or sixth polishing apparatus, the temperature measuring means preferably measures the surface temperature of a region of the contact area of the polishing pad to be subsequently brought in contact with the target surface with the rotation of the polishing pad. The arrangement prevents the situation in which the surface temperature of the polishing pad decreases with time elapsed after polishing and hinders accurate measurement of the surface temperature.

DETAILED DESCRIPTION OF THE INVENTION (First Embodiment)

A polishing apparatus according to a first embodiment of the present invention will be described with reference to the drawings.

Figure 1:
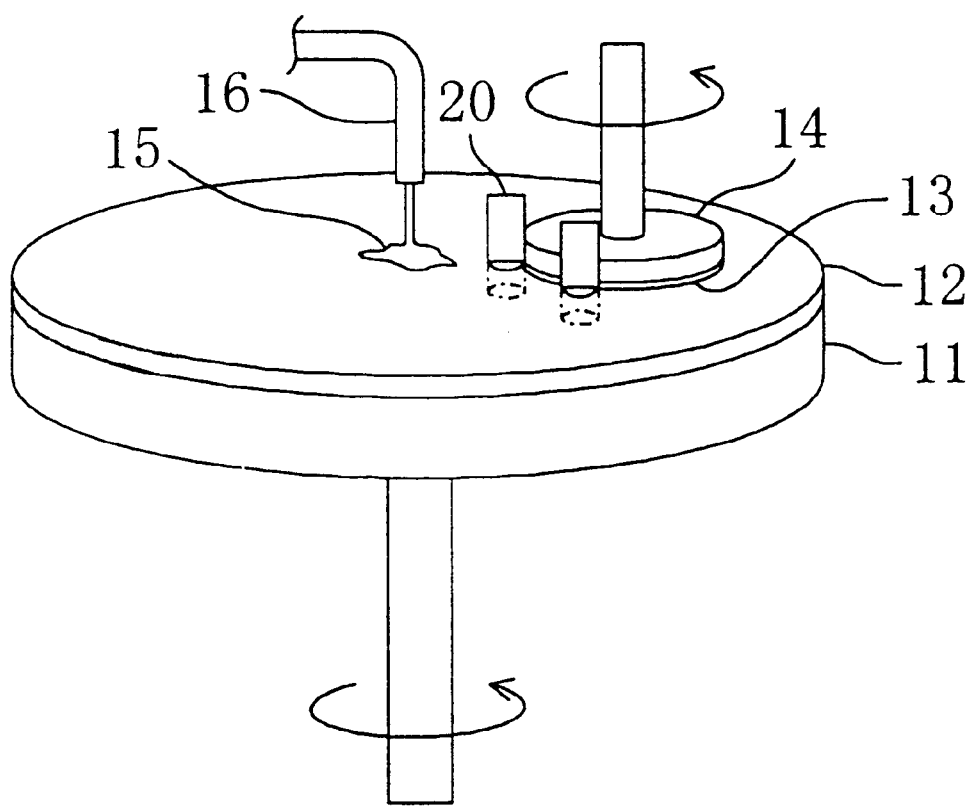
FIG. 1 is a perspective view of a polishing apparatus according to a first embodiment of the present invention.

FIG. 1 shows the schematic structure of the polishing apparatus according to the first embodiment. As shown in the drawing, a rotatable platen 11 composed of a flat rigid body has a polishing pad 12 adhered to the top surface thereof. A carrier 14 as substrate holding means for holding a substrate 13 as a substrate to be polished and a slurry supply pipe 16 for supplying an abrasive slurry 15 onto the polishing pad 12 are provided above the polishing pad 12.

The first embodiment is characterized in that, e.g., two lamps 20 for selectively irradiating the surface of the polishing pad 12 with visible light or infrared light and thereby partially heating the surface of the polishing pad 12 are provided at respective locations above the polishing pad 12 and upstream of the carrier 14 in the direction of rotation of the platen 11. The lamps 20 preferably have high power and a small volume, while emitting a beam smaller in spot size. This is because higher power increases the surface temperature of the polishing pad 12 more rapidly, while a beam smaller in spot size and a smaller volume allow more accurate defining of areas to be irradiated in the surface of the polishing pad 12.

Figure 2A:
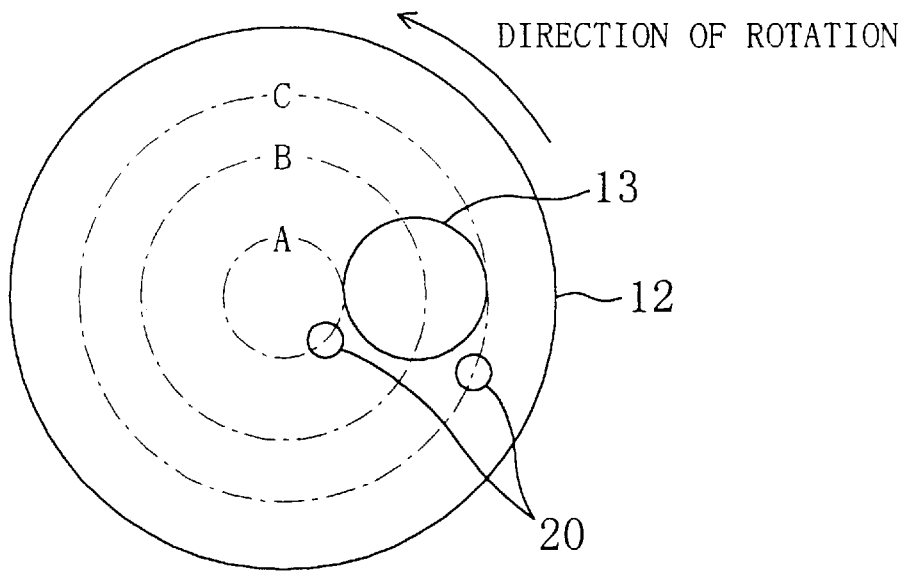
FIGS. 2(a) and 2(b) are respective plan views showing first and second examples of the placement of a lamp in the polishing apparatus according to the first embodiment.

FIG. 2(a) shows a first example of the placement of the lamps 20. As shown in the drawing, the lamps 20 are positioned so as to heat a region A (first region) and a region C (second region) each having a relatively low surface temperature during polishing, while they are not positioned in a region B (third region) having a relatively high surface temperature. The lamps 20 are positioned immediately upstream of the substrate 13 in the direction of rotation of the platen 11 such that the surface regions of the polishing pad 12 heated by the lamps 20 swiftly reach the substrate 13 with the rotation of the platen 11.

Figure 2B:
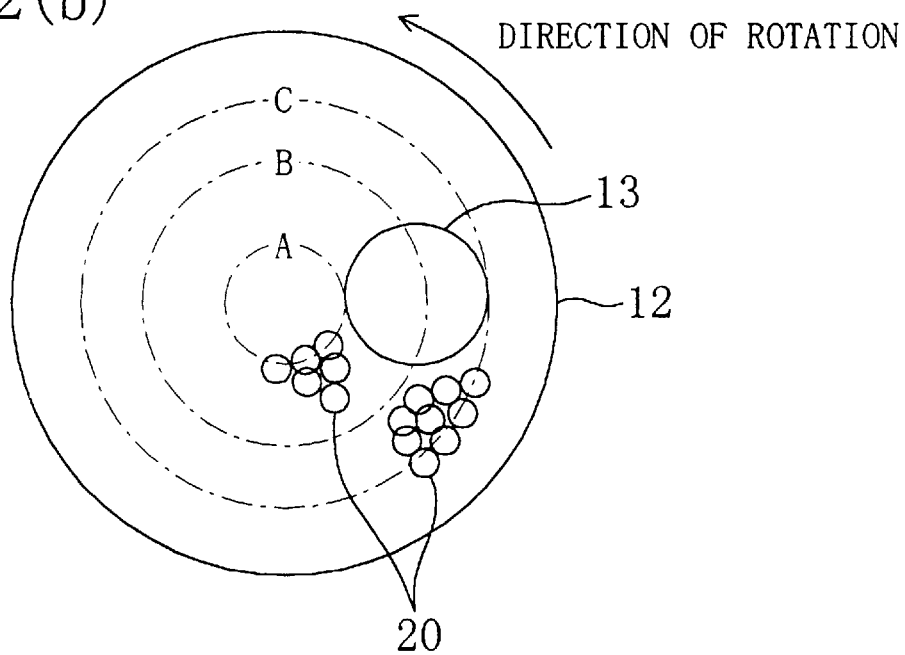

FIG. 2(b) shows a second example of the placement of the lamps 20. The plurality of lamps 20 used in the second example of placement emit light of the same intensity. Since the surface temperature of the polishing pad 12 is the lowest in the regions A and C and gradually increases toward the region B, a larger number of lamps 20 are positioned in the vicinity of the regions A and C, which are gradually decreasing in number toward the region B. Moreover, a larger number of lamps 20 are positioned in the region C than in the region A because the radius of gyration of the polishing pad 12 is larger in the region C (i.e., the region C has a longer circumference than the region A) and hence the surface temperature is less likely to increase.

Although the lamps 20 emit light of the same intensity in the second example of placement, the lamps 20 may emit light of different intensities. This allows the number of the lamps 20 positioned on the same radial region of the polishing pad 12 to be changed properly.

Although the lamps 20 emitting a beam smaller in spot size to the surface of the polishing pad 12 is more likely to reduce a difference in surface temperature, as described above, it is also possible to use light from the lamps 20 without suppressing the spreading of light. If the regions A and C are irradiated with light, boundary regions between the regions A and B and between the regions C and B are also irradiated with light gradually decreasing in intensity, so that variations in surface temperature are suppressed.

Alternatively, it is also possible to use such an electromagnetic wave as to supply thermal energy to the polishing pad 12 or to the abrasive slurry 15 on the polishing pad 12 instead of the radiation of light from the lamps 20.

(Variation of First Embodiment)

A polishing apparatus according to a variation of the first embodiment of the present invention will be described with reference to the drawings.

Figure 3:
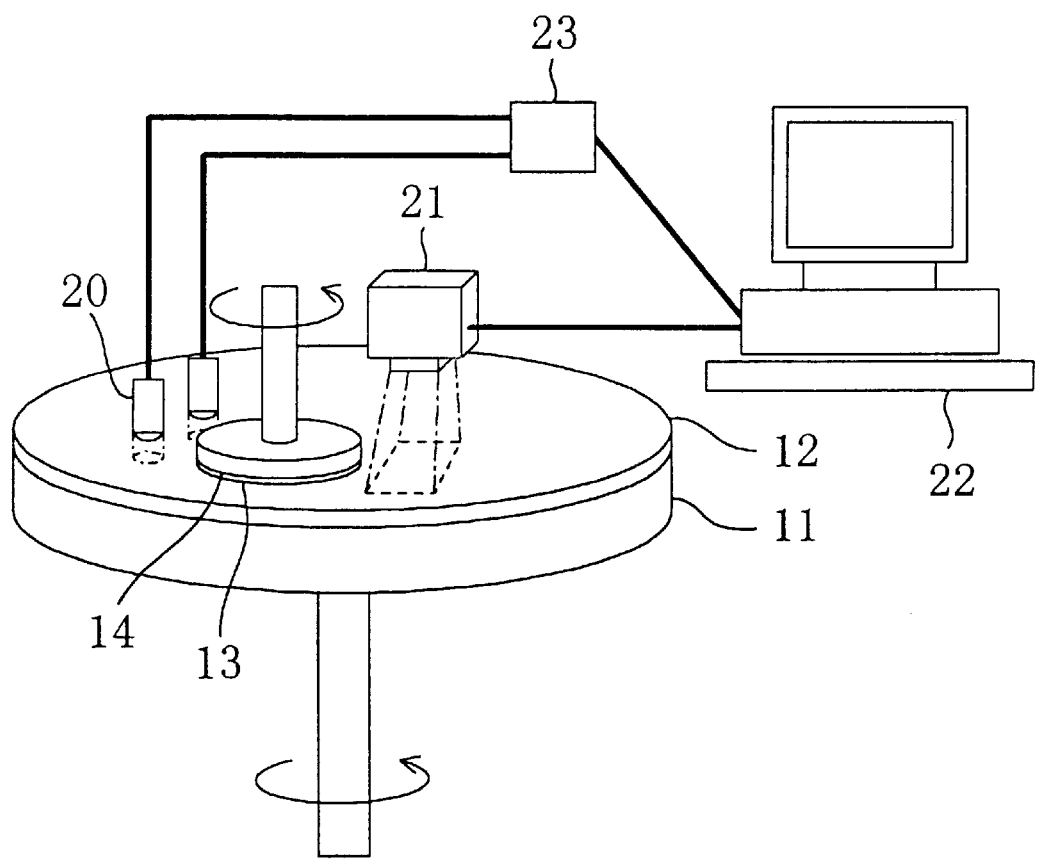
FIG. 3 is a perspective view of a polishing apparatus according to a variation of the first embodiment.

FIG. 3 shows the schematic structure of the polishing apparatus according to the variation of the first embodiment.

The variation of the first embodiment is characterized in that it comprises a lamp control unit for automatically measuring the surface temperature of the polishing pad 12 in two dimensions and automatically controlling the intensity of light from the lamps 20 based on the measured surface temperature. The lamp control unit has: a temperature measuring camera 21 for measuring the surface temperature of the polishing pad 12 in two dimensions without contact therewith; a computer 22 for receiving a temperature signal from the temperature measuring camera 21 and outputting a light intensity signal for the adjustment of the intensity of light from the lamps 20 based on the received temperature signal; and a voltage converter 23 for adjusting a voltage supplied to the lamps 20 based on the light intensity signal from the computer 22. In FIG. 3, the rectangle bordered by the broken lines indicates a region where the temperature measuring camera 21 measures the surface temperature of the polishing pad 12.

Figure 4:
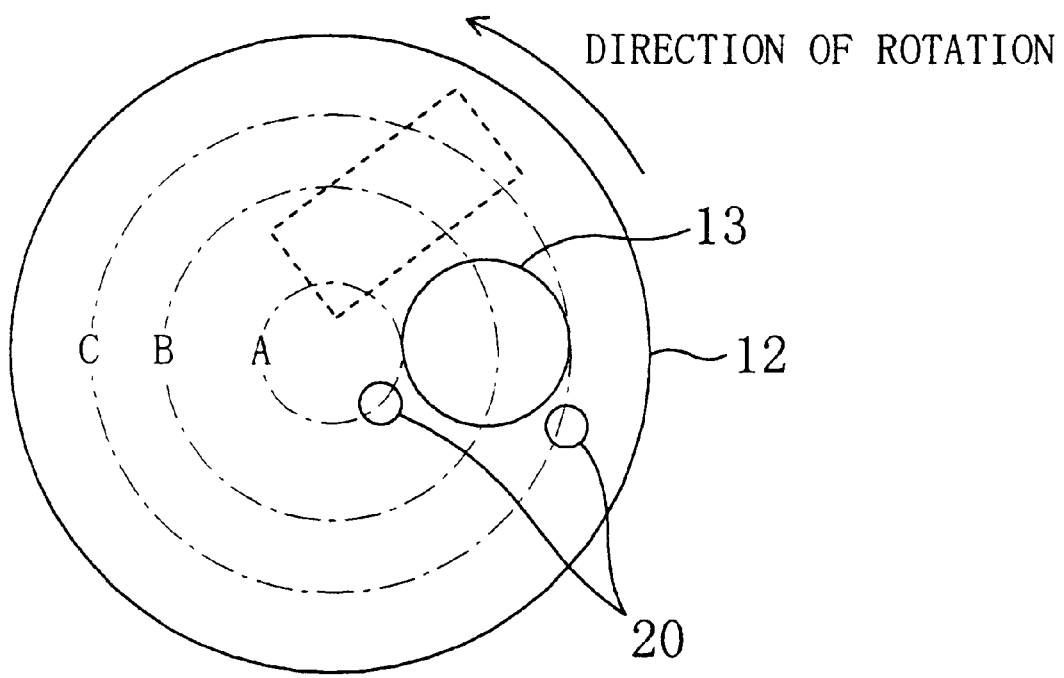
FIG. 4 is a plan view showing a region where a temperature measuring camera of the polishing apparatus according to the variation of the first embodiment measures temperature.

FIG. 4 shows the region where the temperature measuring camera 21 measures the temperature (indicated by the square bordered by the broken lines). As shown in FIG. 4, the temperature measuring camera 21 measures the surface temperature in the region of the polishing pad 12 immediately downstream of the substrate 13 in the direction of rotation of the platen 11. This is because, after the polishing pad 12 passes through the substrate 13, the surface temperature thereof varies with time by the cooling action of the platen 11, abrasive slurry 15, or the like.

The surface temperature of the polishing pad 12 need not necessarily be measured in two dimensions provided that the surface temperature of the polishing pad 12 can be measured in the radial direction. For example, a plurality of radiation thermometers for one-point measurement (a sufficient number of radiation thermometers to detect the distribution of temperature variations) may be arranged in the radial direction of the polishing pad 12 so that the temperature (current) signal indicating the temperature measured by the radiation thermometers is outputted to the computer 22.

It is also possible to provide the lamp control unit with additional driving means for moving the lamps 20 in the radial direction of the polishing pad 12 based on the signal transmitted from the computer 22, though the drawing thereof is omitted. The provision of the additional driving means ensures heating of a surface region of the polishing pad 12 placed between the adjacent lamps 20, which cannot sufficiently be irradiated with light from the fixed lamps 20, e.g., a surface region of the polishing pad 12 interposed between a portion irradiated with light from the lamp 20 positioned in the region C and a portion irradiated with light from the lamp 20 positioned inwardly of the lamp 20 in the region C. As a result, variations in the surface temperature of the polishing pad 12 can further be suppressed and the number of the lamps 20 can be reduced.

A description will be given to a polishing method implemented by using the polishing apparatus according to the first embodiment and the variation thereof.

First, the platen 11 is rotated and the carrier 14 is lowered in level to press the substrate 13 against the polishing pad 12, while the abrasive slurry 15 containing abrasive grains is supplied from the slurry supply pipe 16 onto the polishing pad 12, whereby a target surface of the substrate 13 is polished. To press the substrate 13 against the polishing pad 12, the backing pad pressing method or air pressing method discussed in the description of the prior art may be used appropriately.

In the polishing step, the target surface of the substrate 13 is polished by using the polishing apparatus according to the first embodiment shown in FIG. 1, while the region A (first region) and the region C (second region) each having a relatively low surface temperature during polishing are heated by irradiation with light from the lamps 20 positioned in accordance with the first example of placement shown in FIG. 2(a) or the second example of placement shown in FIG. 2(b). The irradiation of the regions A and C with light from the lamps 20 can be timed in accordance with the method wherein irradiation is initiated simultaneously with the initiation of polishing and continued till the completion of polishing or the method wherein irradiation is initiated prior to the initiation of polishing to previously increase the surface temperature in the regions A and C and continued till the completion of polishing. Since the methods can reduce variations in the surface temperature of the polishing pad 12, variations in the polishing speed of the substrate 13 are also reduced. In accordance with the latter method, in particular, variations in the surface temperature of the polishing pad 12 can further be reduced since the regions A and C of the polishing pad 12 have been preheated by irradiation with light from the lamps 20.

The polishing step may be performed by using the polishing apparatus according to the variation of the first embodiment shown in FIG. 3 instead of the polishing apparatus according to the first embodiment. In this case, the distribution of the varying surface temperature of the polishing pad 12 is measured in two dimensions by the temperature measuring camera 21 whenever necessary or, alternatively, the surface temperature in the radial direction of the polishing pad 12 is measured by the plurality of radiation thermometers for one-point measurement arranged in the radial direction of the polishing pad 12, so that the light intensity signal based on the signal indicating the measured temperature is outputted from the computer 22 to the voltage converter 23 to increase the intensity of light from the lamp 20 for heating the region having a relatively low surface temperature and decrease the intensity of light from the lamp 20 for heating the region having a relatively high surface temperature. The arrangement renders the surface temperature of the polishing pad 12 more uniform and permits the substrate 13 to be polished at a uniform speed. In this case, if the measurement of the surface temperature of the polishing pad 12 and the control of the intensity of light from the lamps 20 are repeatedly performed, the surface temperature of the polishing pad 12 becomes more uniform. Instead of increasing the intensity of light from the lamps 20, it is also possible to bring the lamps 20 closer to the polishing pad 12. Instead of decreasing the intensity of light from the lamps 20, it is also possible to bring the lamps 20 farther away from the polishing pad 12.

Although manual temperature measurement and manual control of the intensity of light (control of a voltage or current supplied to the lamps) can also be performed to provide a uniform temperature over the entire surface of the polishing pad 12 by means of the lamps 20, they are lacking in accuracy and unsuitable for mass production. By contrast, the use of the polishing apparatus according to the variation of the first embodiment to control the radiation from the lamps 20 by means of the light intensity control unit provides a uniform temperature over the entire surface of the polishing pad 12 promptly and accurately.

As described above, the intensity of light from the lamps 20 has been controlled based on the assumption that the carrier 14 applies equal pressure to the substrate 13 to press it against the polishing pad 12 and the relative velocity of the substrate 13 is equal to that of the polishing pad 12. In the case where the pressure or polishing speed is not equal, the region of the polishing pad 12 corresponding to the portion of the substrate 13 polished at a lower speed is irradiated with light from the lamps 20 so that variations in the polishing speed of the substrate 13 are reduced.

(Second Embodiment)

A second embodiment of the present invention will be described with reference to the drawings.

Figure 5:
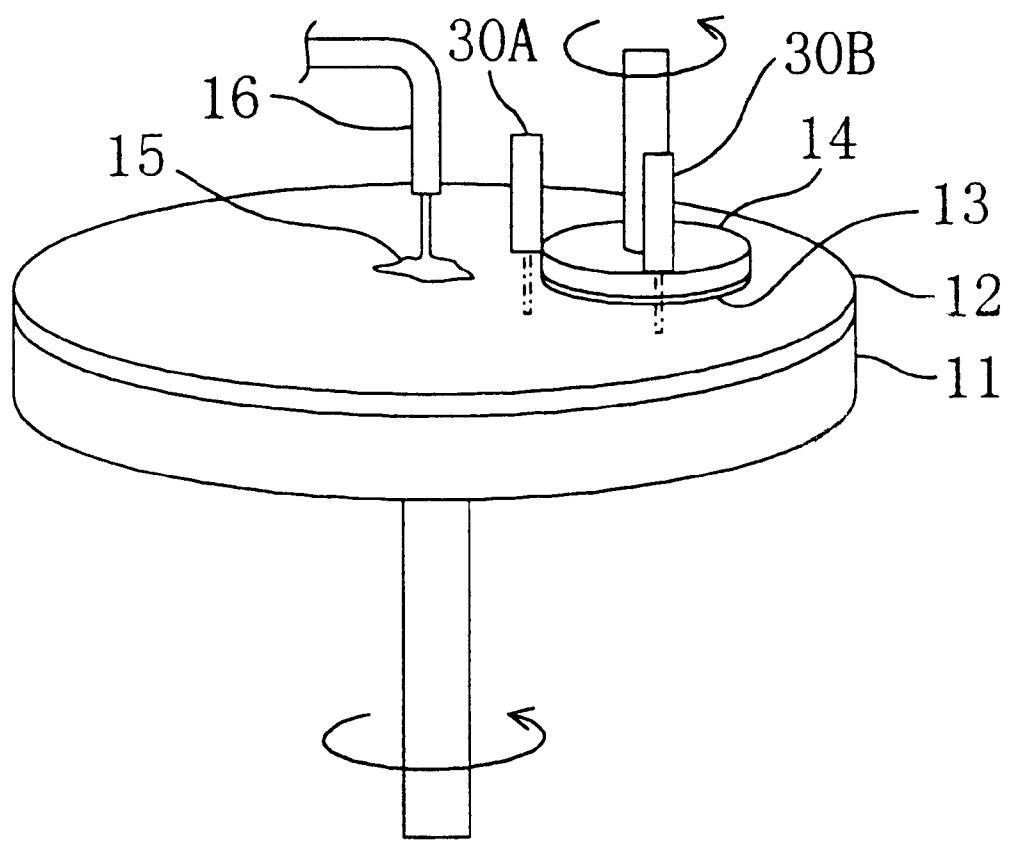
FIG. 5 is a perspective view of a polishing apparatus according to a second embodiment of the present invention.

FIG. 5 shows the schematic structure of the polishing apparatus according to the second embodiment. As shown in the drawing, a rotatable platen 11 composed of a flat rigid body has a polishing pad 12 adhered to the top surface thereof. A carrier 14 as substrate holding means for holding a substrate 13 as a substrate to be polished and a slurry supply pipe 16 for supplying an abrasive slurry 15 onto the polishing pad 12 are provided above the polishing pad 12.

The second embodiment is characterized in that two laser devices 30A and 30B for selectively irradiating the surface of the polishing pad 12 with a laser beam and thereby partially heating the surface of the polishing pad 12 are provided at respective locations above the polishing pad 12 and upstream of the carrier 14 in the direction of rotation of the platen 11. Since the laser beam does not spread, it is small in spot size and has a high energy density so that the surface temperature of the polishing pad 12 is controlled with high accuracy. Each of the laser devices 30A and 30B may be composed of a solid laser device such as a ruby laser, a YAG laser, a glass laser, or the like, of a gas laser device such as an argon laser, a carbon dioxide gas laser, a heliumneon laser, or the like, or of a semiconductor laser device such as a semiconductor laser. It is preferred to use an optimum laser device in consideration of the power and the size of the oscillating source.

Figure 6:
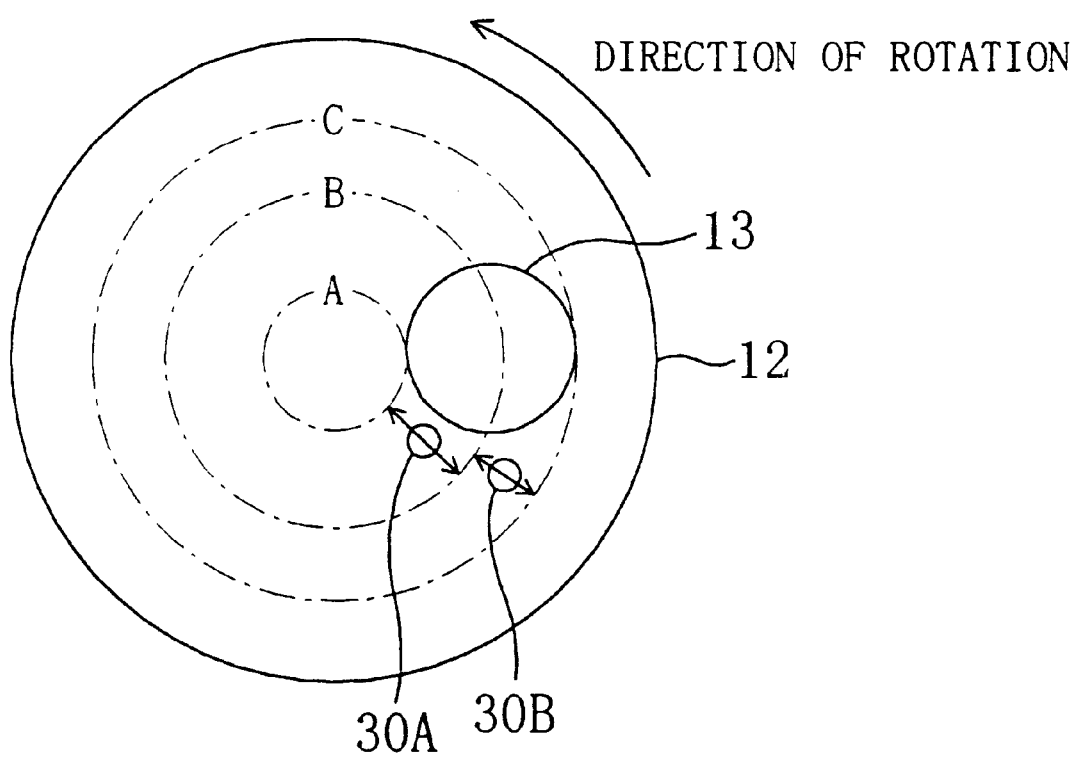
FIG. 6 is a plan view showing an example of the placement of a laser device in the polishing apparatus according to the second embodiment.

FIG. 6 shows an example of the placement of the laser devices 30A and 30B. As shown in the drawing, the laser device 30A in the inner position is movable between the regions A and B in the radial direction of the polishing pad 12. The laser device 30B in the outer position is movable between the regions B and C in the radial direction of the polishing pad 12. The laser devices 30A and 30B are positioned immediately upstream of the substrate 13 in the direction of rotation of the platen 11 such that the surface regions of the polishing pad 12 heated by the laser devices 30A and 30B swiftly reach the substrate 13 with the rotation of the platen 11.

Preferably, a large number of laser devices 30A and 30B are arranged in the radial direction of the polishing pad 12 for the following reason. Since the laser beam emitted from the laser device 30A or 30B is small in spot size, the region where one laser device 30A or 30B can control the temperature is limited in area. However, if the plurality of laser devices 30A and 30B are arranged in the radial direction of the polishing pad 12, the surface temperature of the polishing pad 12 becomes more uniform.

(Variation of Second Embodiment)

A polishing apparatus according to a variation of the second embodiment of the present invention will be described with reference to the drawings.

Figure 7:
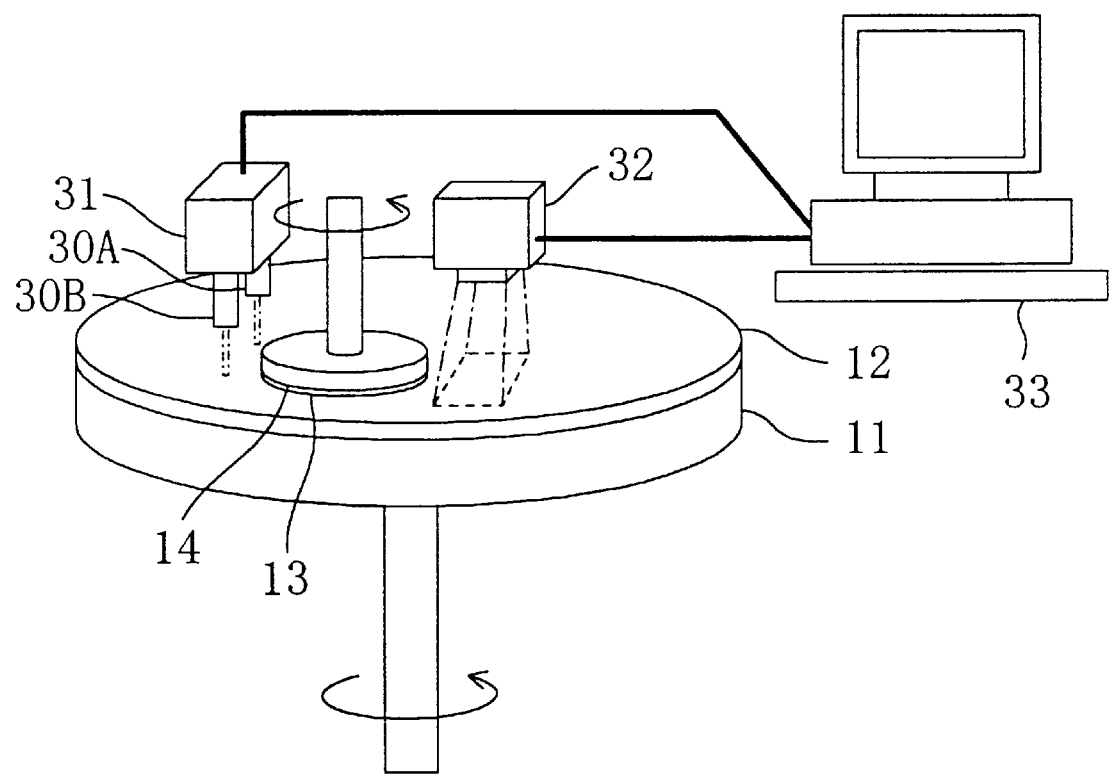
FIG. 7 is a perspective view of a polishing apparatus according to a variation of the second embodiment.

FIG. 7 shows the schematic structure of the polishing apparatus according to the variation of the second embodiment.

The variation of the second embodiment is characterized in that it comprises a laser control unit for automatically measuring the surface temperature of the polishing pad 12 in two dimensions and automatically controlling the radiation from the laser devices 30A and 30B based on the measured surface temperature. The laser control unit has: a driving unit 31 for driving the laser devices 30A and 30B in the radial direction of the polishing pad 12; a temperature measuring camera 32 for measuring the surface temperature of the polishing pad 12 in two dimensions without contact therewith; and a computer 33 for receiving a temperature signal from the temperature measuring camera 32 and operating the driving unit 31 based on the received temperature signal. In FIG. 7, the rectangle bordered by the broken lines indicates a region where the temperature measuring camera 32 measures the surface temperature of the polishing pad 12.

Figure 8:
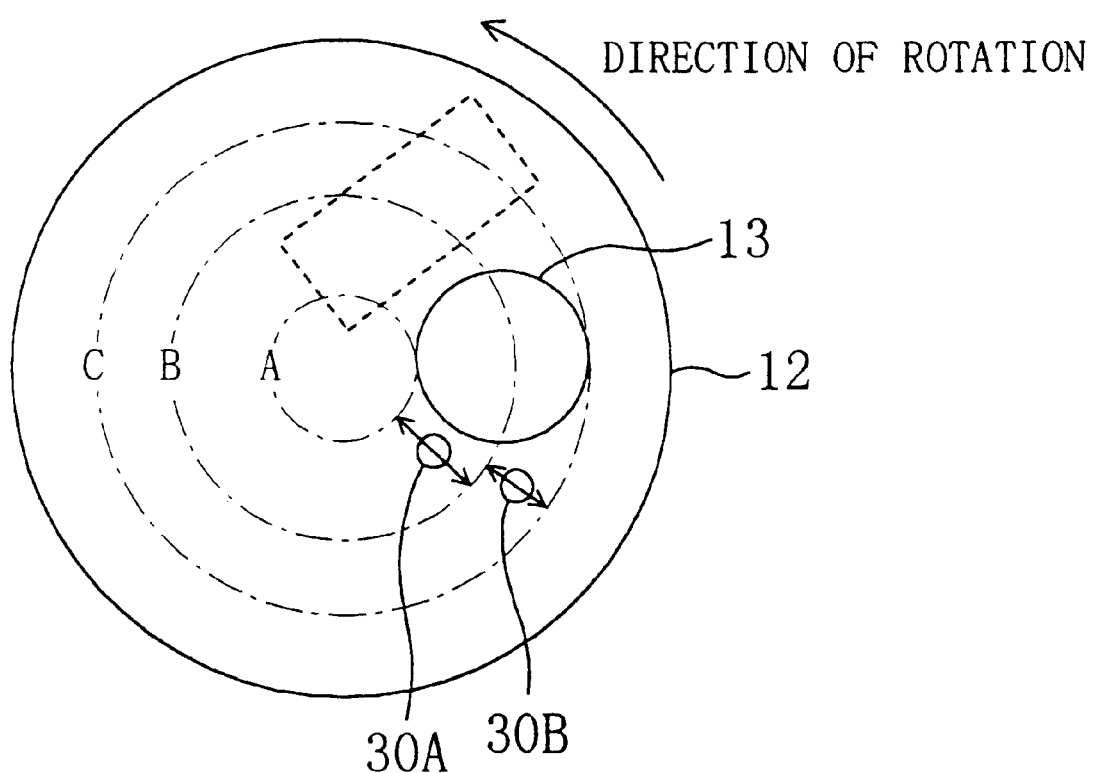
FIG. 8 is a plan view showing a region where a temperature measuring camera of the polishing apparatus according to the variation of the second embodiment measures temperature.

FIG. 8 shows the region where the temperature measuring camera 32 measures the temperature (indicated by the rectangle bordered by the broken lines). As shown in FIG. 8, the temperature measuring camera 32 measures the surface temperature in the region of the polishing pad 12 immediately downstream of the substrate 13 in the direction of rotation of the platen 11. This is because, after the polishing pad 12 passes through the substrate 13, the surface temperature thereof varies with time by the cooling action of the platen 11, abrasive slurry 15, or the like.

The surface temperature of the polishing pad 12 need not necessarily be measured in two dimensions provided that the surface temperature of the polishing pad 12 can be measured in the radial direction. For example, a plurality of radiation thermometers for one-point measurement (a sufficient number of radiation thermometers to detect the distribution of temperature variations) may be arranged in the radial direction of the polishing pad 12 so that the temperature (current) signal indicating the temperature measured by the radiation thermometers is outputted to the computer 33.

It is also possible to provide the laser control unit with additional means for controlling the intensity of radiation from the laser devices 30A and 30B based on the control signal from the computer 33, though the drawing thereof is omitted. To control the intensity of radiation from the laser devices 30A and 30B, there may be used the method wherein the intensity of radiation from the laser devices 30A and 30B is reduced at the time when variations in the surface temperature of the polishing pad 12 are decreasing and the laser devices 30A and 30B are turned off at the time when the surface temperature of the polishing pad 12 becomes uniform.

Alternatively, it is also possible to provide the laser control unit with additional beam-direction controlling means for changing the direction of radiation from the laser devices 30A and 30B based on the control signal from the computer 33 or with an additional mirror unit for reflecting the laser beams emitted from the laser devices 30A and 30B based on the control signal from the computer 33 and thereby guiding the laser beams in a desired direction.

A description will be given to a polishing method implemented by using the polishing apparatus according to the second embodiment and the variation thereof.

First, the platen 11 is rotated and the carrier 14 is lowered in level to press the substrate 13 against the polishing pad 12, while the abrasive slurry 15 containing abrasive grains is supplied from the slurry supply pipe 16 onto the polishing pad 12, whereby a target surface of the substrate 13 is polished. To press the substrate 13 against the polishing pad 12, the backing pad pressing method or air pressing method discussed in the description of the prior art may be used appropriately.

In the polishing step, the target surface of the substrate 13 is polished by using the polishing apparatus according to the second embodiment shown in FIG. 5, while the region A (first region) and the region C (second region) each having a relatively low surface temperature during polishing are heated by irradiation with the laser beams from the laser devices 30A and 30B positioned in accordance with the example of placement shown in FIG. 6. The irradiation of the regions A and C with the laser beams from the laser devices 30A and 30B can be timed in accordance with the method wherein irradiation is initiated simultaneously with the initiation of polishing and continued till the completion of polishing or the method wherein irradiation is initiated prior to the initiation of polishing to previously increase the surface temperature in the regions A and C and continued till the completion of polishing. Since the methods can reduce variations in the surface temperature of the polishing pad 12, variations in the polishing speed of the substrate 13 are also reduced. In accordance with the latter method, in particular, variations in the surface temperature of the polishing pad 12 can further be reduced since the regions A and C of the polishing pad 12 have been preheated by irradiation with the laser beams from the laser devices 30A and 30B.

The polishing step may be performed by using the polishing apparatus according to the variation of the second embodiment shown in FIG. 7 instead of the polishing apparatus according to the second embodiment. In this case, the distribution of the varying surface temperature of the polishing pad 12 is measured in two dimensions by the temperature measuring camera 32 whenever necessary or, alternatively, the surface temperature in the radial direction of the polishing pad 12 is measured by the plurality of radiation thermometers for one-point measurement arranged in the radial direction of the polishing pad 12, so that a drive signal based on the signal indicating the measured temperature is outputted from the computer 33 to the driving unit 31 to control the positioning of respective points to be irradiated with the laser beams from the laser devices 30A and 30B. In this case, if the measurement of the surface temperature of the polishing pad 12 and the control of heating by the laser devices 30A and 30B are repeatedly performed, the surface temperature of the polishing pad 12 becomes more uniform.

Although manual temperature measurement and manual positioning of the points to be irradiated can also be performed to provide a uniform temperature over the entire surface of the polishing pad 12 by means of the laser devices 30A and 30B, they are lacking in accuracy and unsuitable for mass production. By contrast, the use of the polishing apparatus according to the variation of the second embodiment to control the radiation from the laser devices 30A and 30B by means of the laser control unit provides a uniform temperature over the entire surface of the polishing pad 12 promptly and accurately.

The region of the polishing pad having a lower surface temperature may also be heated by using the laser control unit and changing the direction of radiation from the laser devices 30A and 30B based on the control signal from the computer 33 or by using the mirror unit and reflecting the laser beams emitted from the laser devices 30A and 30B based on the control signal from the computer 33.

As described above, the positioning of the points to be irradiated with the laser beams from the laser devices 30A and 30B and the direction of radiation from the laser devices 30A and 30B have been controlled based on the assumption that the carrier 14 applies equal pressure to the substrate 13 to press it against the polishing pad 12 and the relative velocity of the substrate 13 is equal to that of the polishing pad 12. In the case where the pressure or polishing speed is not equal, the region of the polishing pad 12 corresponding to the portion of the substrate 13 polished at a lower speed is irradiated with the laser beams so that variations in the polishing speed of the substrate 13 are reduced.

(Third Embodiment)

A polishing apparatus according to a third embodiment of the present invention will be described with reference to the drawings.

Figure 9:
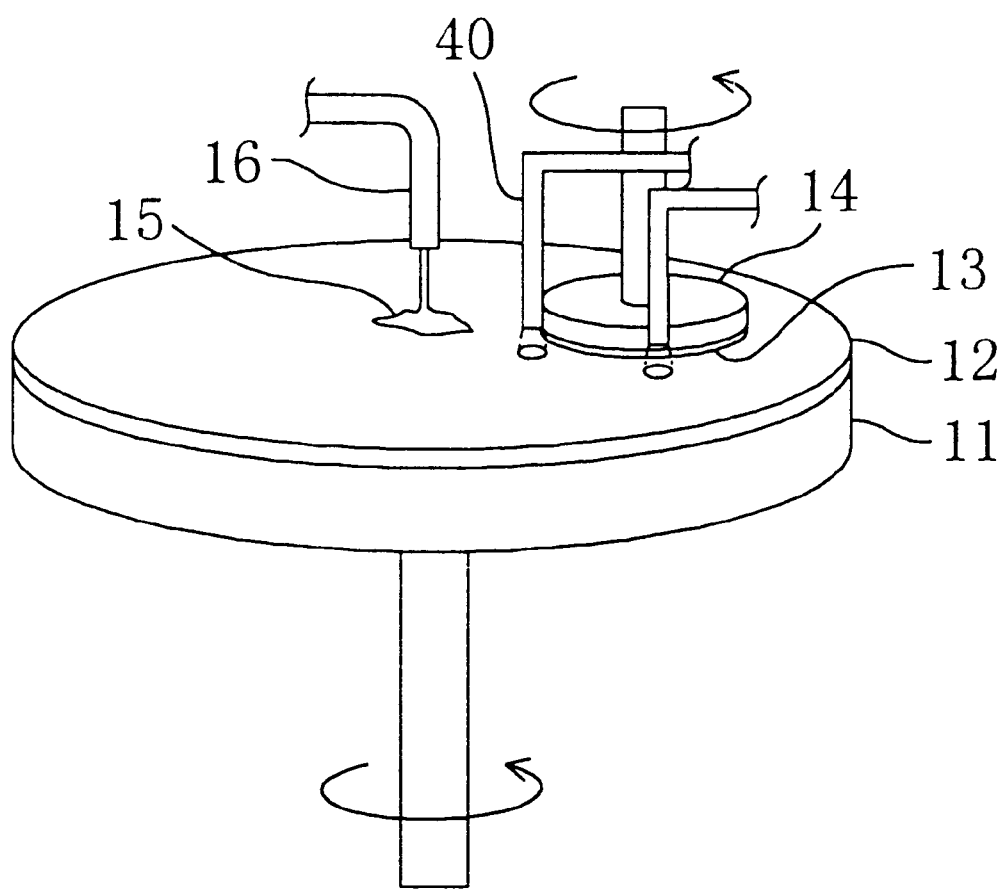
FIG. 9 is a perspective view of a polishing apparatus according to a third embodiment of the present invention.

FIG. 9 shows the schematic structure of the polishing apparatus according to the third embodiment. As shown in the drawing, a rotatable platen 11 composed of a flat rigid body has a polishing pad 12 adhered to the top surface thereof. A carrier 14 as substrate holding means for holding a substrate 13 as a substrate to be polished and a slurry supply pipe 16 for supplying an abrasive slurry 15 onto the polishing pad 12 are provided above the polishing pad 12.

The third embodiment is characterized in that two gas blow pipes 40 for spraying high-temperature gas onto the polishing pad 12 and partially heating the surface of the polishing pad 12 are provided at respective locations above the polishing pad 12 and upstream of the carrier 14 in the direction of rotation of the platen 11. Any high-temperature gas can be supplied from the gas blow pipes 40 provided that it is chemically stable. For instance, a high-temperature air can be used. For the accurate control of the surface temperature of the polishing pad 12, the gas blow pipes 40 preferably have nozzles smaller in diameter.

Figure 10A:
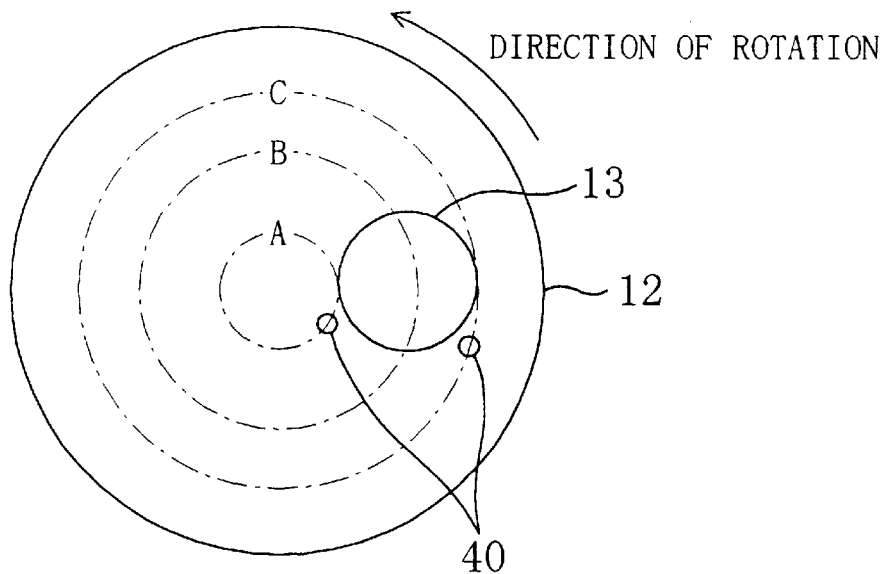
FIGS. 10(a) and 10(b) are respective plan views showing first and second examples of the placement of a gas blow pipe in the polishing apparatus according to the third embodiment.

FIG. 10(a) shows a first example of the placement of the gas blow pipes 40. As shown in the drawing, the gas blow pipes 40 are positioned so as to heat a region A (first region) and a region C (second region) each having a relatively low surface temperature during polishing, while they are not positioned in a region B (second region) having a relatively high surface temperature. The gas blow pipes 40 are also positioned immediately upstream of the substrate 13 in the direction of rotation of the platen 11 such that the surface regions of the polishing pad 12 heated by the gas blow pipes 40 swiftly reach the substrate 13 with the rotation of the platen 11.

Figure 10B:
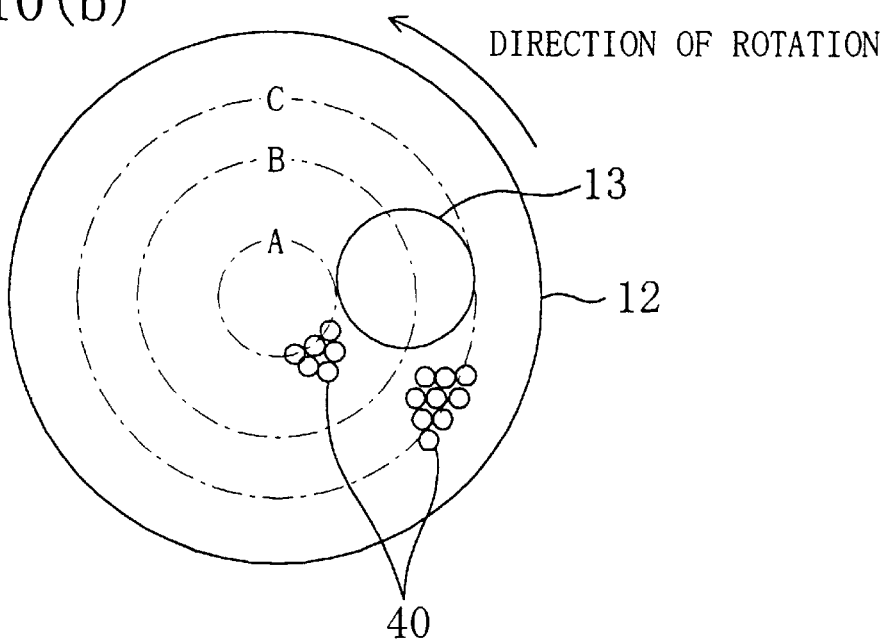

FIG. 10(b) shows a second example of the placement of the gas blow pipes 40. The plurality of gas blow pipes 40 used in the second example of placement supply high-temperature gas at the same flow rate and at the same temperature. Since the surface temperature of the polishing pad 12 is the lowest in the regions A and C and gradually increases toward the region B, a larger number of gas blow pipes 40 are positioned in the vicinity of the regions A and C, which are gradually decreasing in number toward the region B. Moreover, a larger number of gas blow pipes 40 are positioned in the region C than in the region A because the radius of gyration of the polishing pad 12 is larger in the region C and hence the surface temperature is less likely to increase.

Although the gas blow pipes 40 supply high-temperature gas at the same flow rate and at the same temperature in the second example of placement, the gas blow pipes 40 may supply high-temperature gas at different flow rates and at different temperatures. This allows the number of the gas blow pipes 40 positioned on the same radial region of the polishing pad 12 to be changed properly.

(Variation of Third Embodiment)

A polishing apparatus according to a variation of the third embodiment of the present invention will be described with reference to the drawings.

Figure 11:
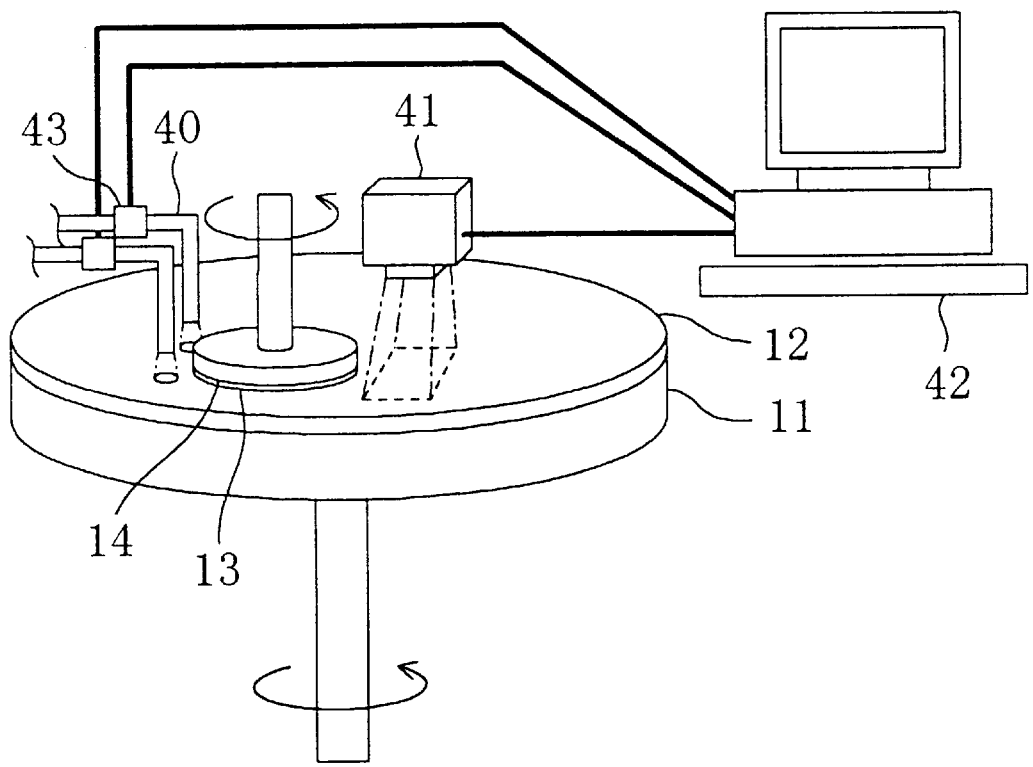
FIG. 11 is a perspective view of a polishing apparatus according to a variation of the third embodiment.

FIG. 11 shows the schematic structure of the polishing apparatus according to the variation of the third embodiment.

The variation of the third embodiment is characterized in that it comprises a gas-flow control unit for automatically measuring the surface temperature of the polishing pad 12 in two dimensions and automatically controlling the spraying power of the gas blow pipes 40 based on the measured surface temperature. The gas-flow control unit has: a temperature measuring camera 41 for measuring the surface temperature of the polishing pad 12 in two dimensions without contact therewith; a computer 42 for receiving a temperature signal from the temperature measuring camera 41 and outputting a flow rate signal for the adjustment of the flow rate of the high-temperature gas to the gas blow pipes 40 based on the received temperature signal; and a flow-rate regulating valve 43 for regulating the flow rate of the high-temperature gas supplied to the gas blow pipes 40 based on the flow rate signal from the computer 42. In FIG. 11, the rectangle bordered by the broken lines indicates a region where the temperature measuring camera 41 measures the surface temperature of the polishing pad 12.

Figure 12:
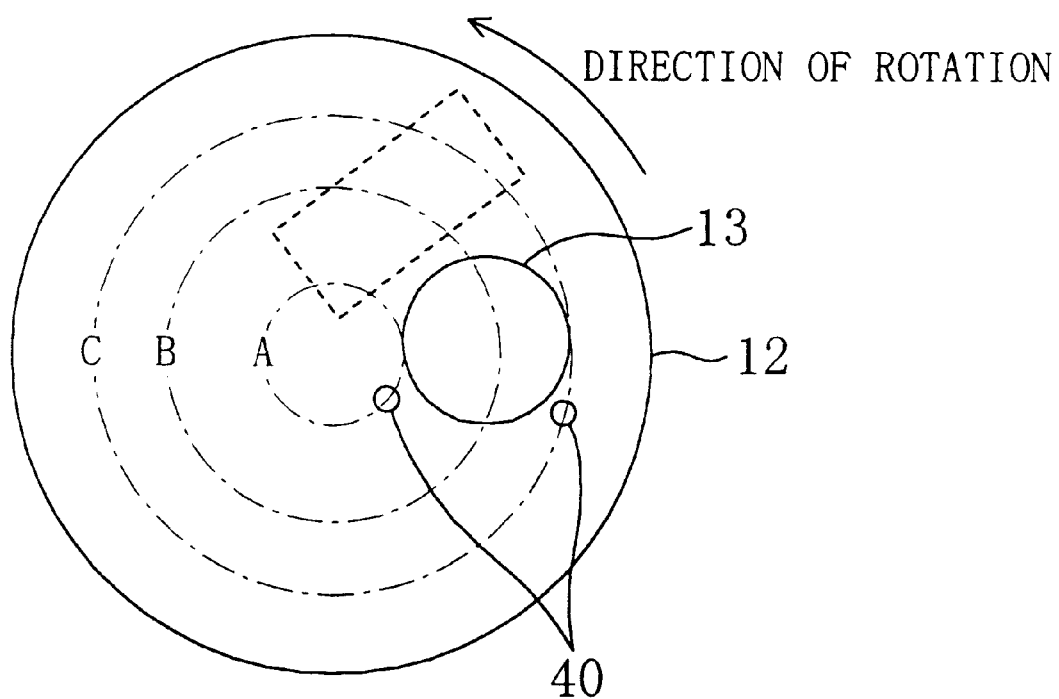
FIG. 12 is a plan view showing a region where a temperature measuring camera of the polishing apparatus according to the variation of the third embodiment measures temperature.

FIG. 12 shows the region where the temperature measuring camera 41 measures the temperature (indicated by the rectangle bordered by the broken lines). As shown in FIG. 12, the temperature measuring camera 41 measures the surface temperature in the region of the polishing pad 12 immediately downstream of the substrate 13 in the direction of rotation of the platen 11. This is because, after the polishing pad 12 passes through the substrate, the surface temperature thereof varies with time by the cooling action of the platen 11, abrasive slurry 15, or the like.

The surface temperature of the polishing pad 12 need not necessarily be measured in two dimensions provided that the surface temperature of the polishing pad 12 can be measured in the radial direction. For example, a plurality of radiation thermometers for one-point measurement (a sufficient number of radiation thermometers to detect the distribution of temperature variations) may be arranged in the radial direction of the polishing pad 12 so that the temperature (current) signal indicating the temperature measured by the radiation thermometers is outputted to the computer 42.

Instead of the flow-rate regulating valve 43, the gas-flow control unit may also be provided with means for controlling the flow rate of the high-temperature gas supplied from the gas low pipes 40 by varying the rotation number of blowing fans provided in the gas blow pipes 40.

The surface temperature of the polishing pad 12 can be controlled with higher accuracy if the gas-flow control unit is provided with additional means for controlling the temperature of the high-temperature gas supplied from the gas blow pipes 40 based on the signal from the computer 42, though the drawing thereof is omitted.

It is also possible to provide the gas-flow control unit with additional means for moving the gas blow pipes 40 in the radial direction of the polishing pad 12 based on the signal transmitted from the computer 42, though the drawing thereof is omitted. The provision of the additional driving means ensures heating of a surface region of the polishing pad 12 placed between the adjacent gas blow pipes 40, which can not receive a sufficient amount of gas sprayed from the gas blow pipes 40, e.g., a surface region of the polishing pad 12 interposed between a portion sprayed with gas from the gas blow pipe 40 placed in the region C and a portion sprayed with gas from the gas blow pipe 40 placed inwardly of the gas blow pipe 40 in the region C. As a result, variations in the surface temperature of the polishing pad 12 can further be suppressed and the number of the gas blow pipes 40 can be reduced. The gas flow controller may also be provided with additional means for bringing the gas blow pipes 40 closer to or farther away from the polishing pad 12 based on the signal transmitted from the computer 42.

A description will be given to a polishing method implemented by using the polishing apparatus according to the third embodiment and the variation thereof.

First, the platen 11 is rotated and the carrier 14 is lowered in level to press the substrate 13 against the polishing pad 12, while the abrasive slurry 15 containing abrasive grains is supplied from the slurry supply pipe 16 onto the polishing pad 12, whereby a target surface of the substrate 13 is polished. To press the substrate 13 against the polishing pad 12, the backing pad pressing method or air pressing method discussed in the description of the prior art may be used appropriately.

In the polishing step, the target surface of the substrate 13 is polished by using the polishing apparatus according to the third embodiment shown in FIG. 9, while the region A (first region) and the region C (second region) each having a relatively low surface temperature during polishing are heated by the high-temperature gas sprayed thereon from the gas blow pipes 40 positioned in accordance with the first example of placement shown in FIG. 10(a) or the second example of placement shown in FIG. 10(b). The spraying of the regions A and C with the high-temperature gas from the gas blow pipes 40 can be timed in accordance with the method wherein spraying is initiated simultaneously with the initiation of polishing and continued till the completion of polishing or the method wherein spraying is initiated prior to the initiation of polishing to previously increase the surface temperature in the regions A and C and continued till the completion of polishing. Since the methods can reduce variations in the surface temperature of the polishing pad 12, variations in the polishing speed of the substrate 13 are also reduced. In accordance with the latter method, in particular, variations in the surface temperature of the polishing pad 12 can further be reduced since the regions A and C of the polishing pad 12 have been preheated with the high-temperature gas sprayed from the gas blow pipes 40.

The polishing step may be performed by using the polishing apparatus according to the variation of the third embodiment shown in FIG. 11 instead of the polishing apparatus according to the third embodiment. In this case, the distribution of the surface temperature of the polishing pad 12 is measured in two dimensions by the temperature measuring camera 41 whenever necessary or, alternatively, the surface temperature in the radial direction of the polishing pad 12 is measured by the plurality of radiation thermometers for one-point measurement arranged in the radial direction of the polishing pad 12, so that the flow rate signal based on the signal indicating the measured temperature is outputted from the computer 42 to the flow-rate regulating valve 43 to increase the flow rate of the high-temperature gas from the gas blow pipe 40 for heating the region having a comparatively low surface temperature and decrease the flow rate of the high-temperature gas from the gas blow pipe 40 for heating the region having a comparatively high surface temperature. The arrangement renders the surface temperature excellently uniform over the polishing pad 12 and permits the substrate 13 to be polished at a uniform speed. In this case, if the measurement of the surface temperature of the polishing pad 12 and the control of the flow rate of the high-temperature gas are repeatedly performed, the surface temperature of the polishing pad 12 becomes more uniform.

Although manual temperature measurement and manual control of the flow rate can also be performed to provide a uniform temperature over the entire surface of the polishing pad 12 by means of the gas blow pipes 40, they are lacking in accuracy and unsuitable for mass production. By contrast, the use of the polishing apparatus according to the variation of the third embodiment to control the flow rate of the high-temperature gas from the gas blow pipes 40 by means of the gas-flow control unit provides a uniform temperature over the entire surface of the polishing pad 12 promptly and accurately.

Instead of changing the flow rate of the high-temperature gas supplied from the gas blow pipes 40, the surface temperature of the polishing pad 12 may also be controlled by changing respective positions at which the gas blow pipes 40 supplies the high-temperature gas (the positions in the radial direction of the polishing pad 12 or the vertical positions relative to the polishing pad 12).

As described above, the flow rate of the high-temperature gas from the gas blow pipes 40 has been controlled based on the assumption that the carrier 14 applies equal pressure to the substrate 13 to press it against the polishing pad 12 and the relative velocity of the substrate 13 is equal to that of the polishing pad 12. In the case where the pressure or polishing speed is not equal, the region of the polishing pad 12 corresponding to the portion of the substrate 13 polished at a lower speed is sprayed with the high-temperature gas from the gas blow pipes 40 so that variations in the polishing speed of the substrate 13 are reduced.

Although the foregoing description has been given to the case where the high-temperature gas is supplied from the gas blow pipes 40, low-temperature gas may also be supplied from the gas blow pipes 40 instead. The arrangement is for reducing variations in the surface temperature of the polishing pad 12 by cooling, not heating, the surface of the polishing pad 12. In contrast to the case where the high-temperature gas is sprayed onto the regions A and C, the low-temperature gas is sprayed onto the region B (third region).

It is also possible to provide the high-temperature gas blow pipe for spraying the high-temperature gas as well as a low-temperature blow pipe for spraying the low temperature gas such that the low-temperature gas is sprayed onto the region B of the polishing pad 12 having a higher surface temperature and that the high-temperature gas is sprayed onto the regions A and C of the polishing pad 12 each having a lower surface temperature. The arrangement allows the surface temperature of the polishing pad 12 to be adjusted in a shorter period of time.

(Fourth Embodiment)

A polishing apparatus according to a fourth embodiment of the present invention will be described with reference to the drawings.

Figure 13:
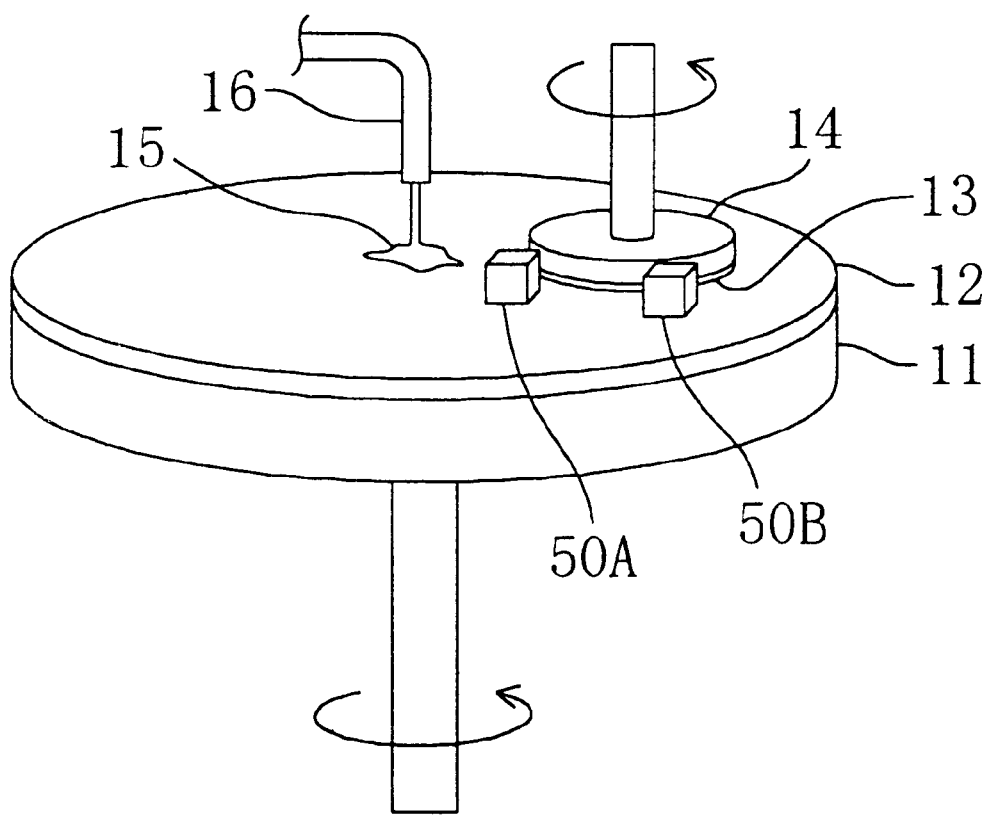
FIG. 13 is a perspective view of a polishing apparatus according to a fourth embodiment of the present invention.

FIG. 13 shows the schematic structure of the polishing apparatus according to the fourth embodiment. As shown in the drawing, a rotatable platen 11 composed of a flat rigid body has a polishing pad 12 adhered to the top surface thereof. A carrier 14 as substrate holding means for holding a substrate 13 as a substrate to be polished and a slurry supply pipe 16 for supplying an abrasive slurry 15 onto the polishing pad 12 are provided above the polishing pad 12.

The fourth embodiment is characterized in that two high-temperature solid members 50A and 50B each in the form of a hollow rectangular parallelepiped are provided at respective locations above the polishing pad 12 and upstream of the carrier 14 in the direction of rotation of the platen 11 so as to partially heat the surface of the polishing pad 12. The high-temperature solid members 50A and 50B are internally provided with heating wires for increasing the temperature thereof. Preferably, the material composing the high-temperature solid members 50A and 50B is a metal excellent in heat conductivity, such as iron or copper. Since the high-temperature solid members 50A and 50B are in direct contact with the surface of the polishing pad 12, they are preferably composed of a material chemically unreactive with the acidic or alkaline abrasive slurry 15. As a material having resistance to an acid or alkali, there can be listed teflon (polytetrafluoroethylene). At least the portions of the surfaces of the high-temperature solid members 50A and 50B in direct contact with the abrasive slurry 15 are preferably coated with Teflon. In this case, the coating layers of Teflon are preferably thick, since they are mechanically grated by abrasive grains contained in the abrasive slurry. However, since Teflon has a poor heat conductivity, it is preferred to design coating layers having an optimum thickness in consideration of the circumstances. Instead of Teflon, ceramic, diamond, or silicon may compose the coating layers formed on the surfaces of the high-temperature solid members 50A and 5OB.

The heating wires may also be provided externally of the high-temperature solid members 50A and 50B such that heat is conducted from the heating wires to metal elements placed within the high-temperature solid members 50A and 50B via other metal elements connected to the foregoing metal elements.

The varying surface temperature of the polishing pad 12 can be controlled with higher accuracy with the high-temperature solid members 50A and 50B smaller in size. However, the high-temperature solid members 50A and 50B in larger size transmit a larger amount of heat to the polishing pad 12. Hence, it is preferred to use the high-temperature solid members 50A and 50B in optimum size. The configurations of the high-temperature solid members 50A and 50B are not particularly limited.

To increase the temperature of the solid members 50A and 50B, a high-temperature liquid or high-temperature gas may also be allowed to pass through the solid members 50A and 50B or piping allowing the passage of a high-temperature liquid or high-temperature gas therethrough may also be provided within the solid members 50A and 50B, instead of providing the heating wires.

Figure 14:
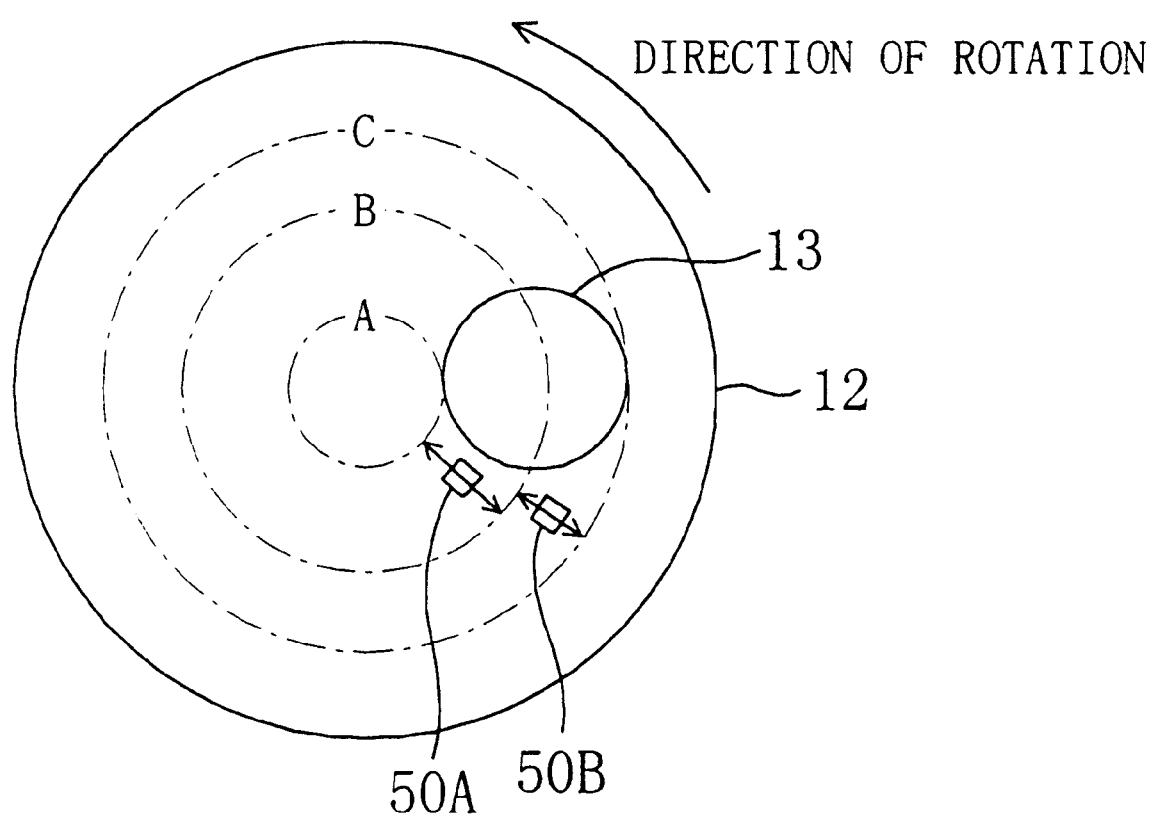
FIG. 14 is a plan view showing an example of the placement of a high-temperature solid member in the polishing apparatus according to the fourth embodiment.

FIG. 14 shows an example of the placement of the high-temperature solid members 50A and 50B. As shown in the drawing, the high-temperature solid member 50A in the inner position is movable between the regions A and B in the radial direction of the polishing pad 12. The high-temperature solid member 50B in the outer position is movable between the regions B and C in the radial direction of the polishing pad 12. The high-temperature solid members 50A and 50B are positioned immediately upstream of the substrate 13 in the direction of rotation of the platen 11 such that the surface regions of the polishing pad 12 heated by the high-temperature solid members 50A and 50B swiftly reach the substrate 13 with the rotation of the platen 11.

As for the number of the high-temperature solid members 50A and 50B, it is not particularly limited. However, two, three, or more high-temperature solid members are preferably provided, since it is difficult to control the temperature in a short period of time with only one high-temperature solid member.

(Variation of Fourth Embodiment)

A polishing apparatus according to a variation of the fourth embodiment of the present invention will be described with reference to the drawings.

Figure 15:
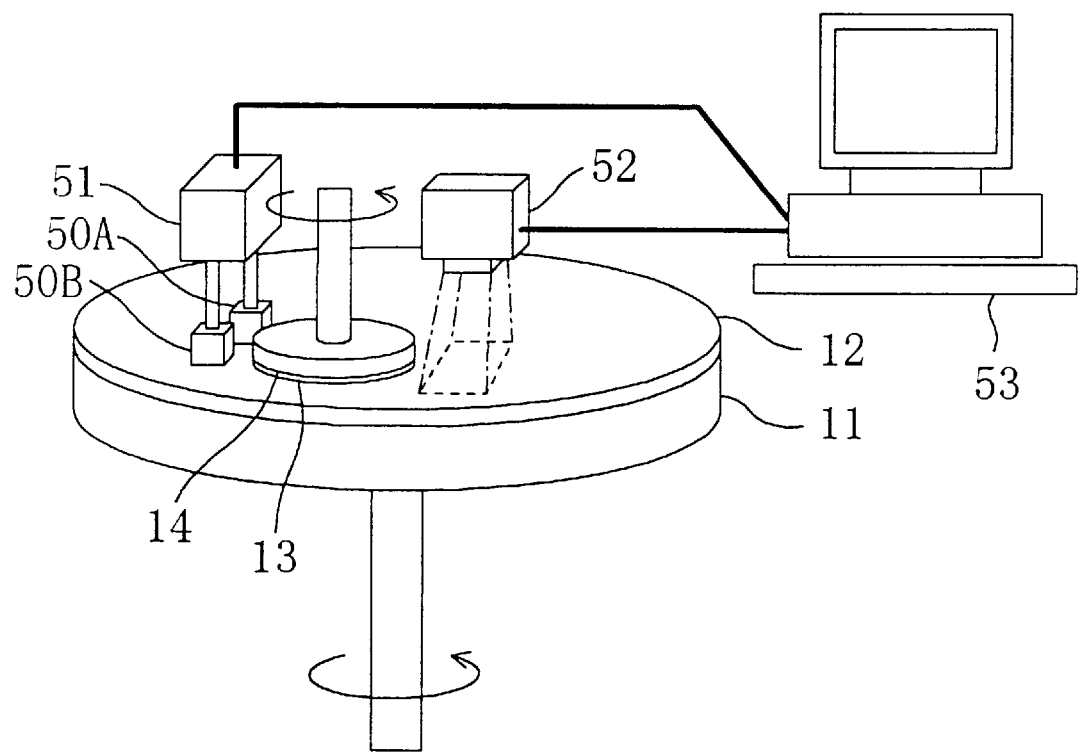
FIG. 15 is a perspective view of a polishing apparatus according to a variation of the fourth embodiment.

FIG. 15 shows the schematic structure of the polishing apparatus according to the variation of the fourth embodiment.

The variation of the fourth embodiment is characterized in that it comprises a high-temperature-solid-member control unit for automatically measuring the surface temperature of the polishing pad 12 in two dimensions and automatically controlling heating by the high-temperature solid members 50A and 50B based on the measured surface temperature. The high-temperature-solid-member control unit has: a driving unit 51 for driving the high-temperature solid members 50A and 50B in the radial direction of the polishing pad 12; a temperature measuring camera 52 for measuring the surface temperature of the polishing pad 12 in two dimensions without contact therewith; and a computer 53 for receiving a temperature signal from the temperature measuring camera 52 and operating the driving unit 51 based on the received temperature signal. In FIG. 15, the rectangle bordered by the broken lines indicates a region where the temperature measuring camera 52 measures the surface temperature of the polishing pad 12.

Figure 16:
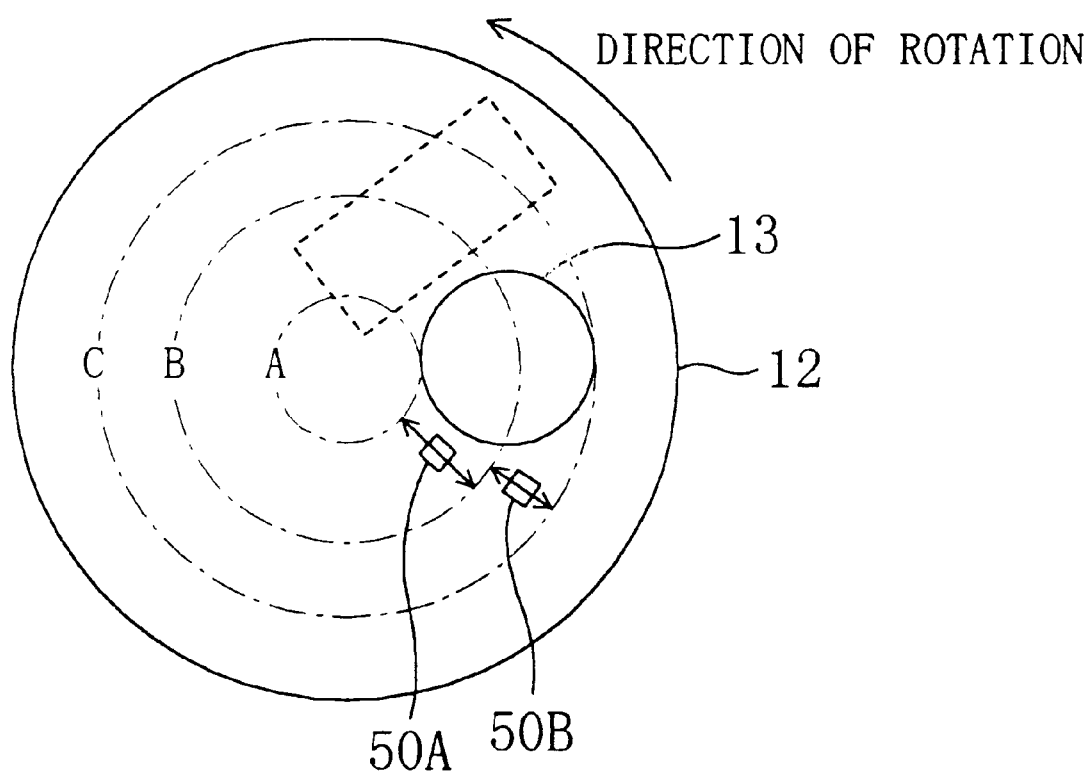
FIG. 16 is a plan view showing a region where a temperature measuring camera of the polishing apparatus according to the variation of the fourth embodiment measures temperature.

FIG. 16 shows the region where the temperature measuring camera 52 measures the temperature (indicated by the rectangle bordered by the broken lines). As shown in FIG. 16, the temperature measuring camera 52 measures the surface temperature in the region immediately downstream of the substrate 13 in the direction of rotation of the platen 11. This is because, after the polishing pad 12 passes through the substrate 13, the surface temperature thereof varies with time by the cooling action of the platen 11, the abrasive slurry 15, or the like.

The surface temperature of the polishing pad 12 need not necessarily be measured in two dimensions provided that the surface temperature of the polishing pad 12 can be measured in the radial direction. For example, a plurality of radiation thermometers for one-point measurement (a sufficient number of radiation thermometers to detect the distribution of temperature variations) may be arranged in the radial direction of the polishing pad 12 so that the temperature (current) signal indicating the temperature measured by the radiation thermometers is outputted to the computer 53.

It is also possible to provide the high-temperature-solid-member control unit with additional means for controlling the temperature of the high-temperature solid members 50A and 50B based on the control signal from the computer 53, though the drawing thereof is omitted. To control the temperature of the solid members 50A and 50B, there may be used a method wherein the temperature of the solid members 50A and 50B is reduced at the time when variations in the surface temperature of the polishing pad 12 are reduced and the heating of the solid members 50A and 50B is ceased at the time when the surface temperature of the polishing pad 12 becomes uniform. To cease the heating of the solid members 50A and 50B, there may be used a method wherein the solid members 50A and 50B, which are vertically movable, are moved upward to be away from the polishing pad 12.

A description will be given to a polishing method implemented by using the polishing apparatus according to the fourth embodiment and the variation thereof.

First, the platen 11 is rotated and the carrier 14 is lowered in level to press the substrate 13 against the polishing pad 12, while the abrasive slurry 15 containing abrasive grains is supplied from the slurry supply pipe 16 onto the polishing pad 12, whereby a target surface of the substrate 13 is polished. To press the substrate 13 against the polishing pad 12, the backing pad pressing method or air pressing method discussed in the description of the prior art may be used appropriately.

In the polishing step, the target surface of the substrate 13 is polished by using the polishing apparatus according to the fourth embodiment shown in FIG. 13, while the region A (first region) and the region C (third region) each having a relatively low surface temperature during polishing are heated by the high-temperature solid members 50A and 50B positioned in accordance with the example of placement shown in FIG. 14. The heating of the regions A and C by the high-temperature solid members 50A and 50B can be timed in accordance with the method wherein heating is initiated simultaneously with the initiation of polishing and continued till the completion of polishing or the method wherein heating is initiated prior to the initiation of polishing to previously increase the surface temperature in the regions A and C and continued till the completion of polishing. Since the methods can reduce variations in the surface temperature of the polishing pad 12, variations in the polishing speed of the substrate 13 are also reduced. In accordance with the latter method, in particular, variations in the surface temperature of the polishing pad 12 can further be reduced since the regions A and C of the polishing pad 12 have been preheated by the high-temperature solid members 50A and 50B.

The polishing step may be performed by using the polishing apparatus according to the variation of the fourth embodiment shown in FIG. 15 instead of the polishing apparatus according to the fourth embodiment. In this case, the distribution of the surface temperature of the polishing pad 12 is measured in two dimensions by the temperature measuring camera 52 whenever as necessary or, alternatively, the surface temperature in the radial direction of the polishing pad 12 is measured by the plurality of radiation thermometers for one-point measurement arranged in the radial direction of the polishing pad 12, so that a drive signal based on the signal indicating the measured temperature is outputted from the computer 53 to the driving unit 51 to control the positioning of respective points to be brought in contact with the high-temperature solid members 50A and 50B. In this case, if the measurement of the surface temperature of the polishing pad 12 and the positioning of the contact points are repeatedly performed, the surface temperature of the polishing pad 12 becomes more uniform.

Although manual temperature measurement and manual positioning of the points to be heated can also be performed to provide a uniform temperature across the entire surface of the polishing pad 20 by means of the high-temperature solid members 50A and 50B, they are lacking in accuracy and unsuitable for mass production. By contrast, the use of the polishing apparatus according to the variation of the fourth embodiment to control the positioning of the points to be heated by the high-temperature solid members 50A and 50B by means of the high-temperature-solid-member control unit provides a uniform temperature over the entire surface of the polishing pad 12 promptly and accurately.

As described above, the positioning of the points to be heated by the high-temperature solid members 50A and 50B has been controlled based on the assumption that the carrier 14 applies equal pressure to the substrate 13 to press it against the polishing pad 12 and the relative velocity of the substrate 13 is equal to that of the polishing pad 12. In the case where the pressure or polishing speed is not equal, the region of the polishing pad 12 corresponding to the portion of the substrate 13 polished at a lower speed is heated so that variations in the polishing speed of the substrate 13 are reduced.

Although the foregoing description has been given to the case where the polishing pad 12 is heated with the high-temperature solid members 50A and 50B, the polishing pad 12 may also be cooled with a low-temperature solid member instead of the high-temperature solid members 50A and 50B. The arrangement is for reducing variations in the surface temperature of the polishing pad 12 by cooling, not heating, the surface of the polishing pad 12. In contrast to the case where the regions A and C are heated with the high-temperature solid members 50A and 50B, the region B (third region) is cooled with the low-temperature solid member.

It is also possible to provide the high-temperature solid member as well as the low-temperature solid member such that the region B of the polishing pad 12 having a relatively high surface temperature is cooled by the low-temperature solid member and that the regions A and C of the polishing pad 12 each having a relatively low surface temperature are heated with the high-temperature solid members. This allows the surface temperature of the polishing pad 12 to be controlled in a shorter period of time.

To reduce the temperature of the solid member, the solid member may be formed hollow so that a low-temperature fluid such as liquid nitrogen or nitrogen gas obtained by vaporizing liquid nitrogen is allowed to pass through the solid member or piping allowing the passage of the low-temperature fluid therethrough may also be provided within the solid member. Preferably, the low-temperature solid member is also formed with the coating layer unreactive with the abrasive slurry, similarly to the high-temperature solid members.

(Fifth Embodiment)

A polishing apparatus according to a fifth embodiment of the present invention will be described with reference to the drawings.

Figure 17:
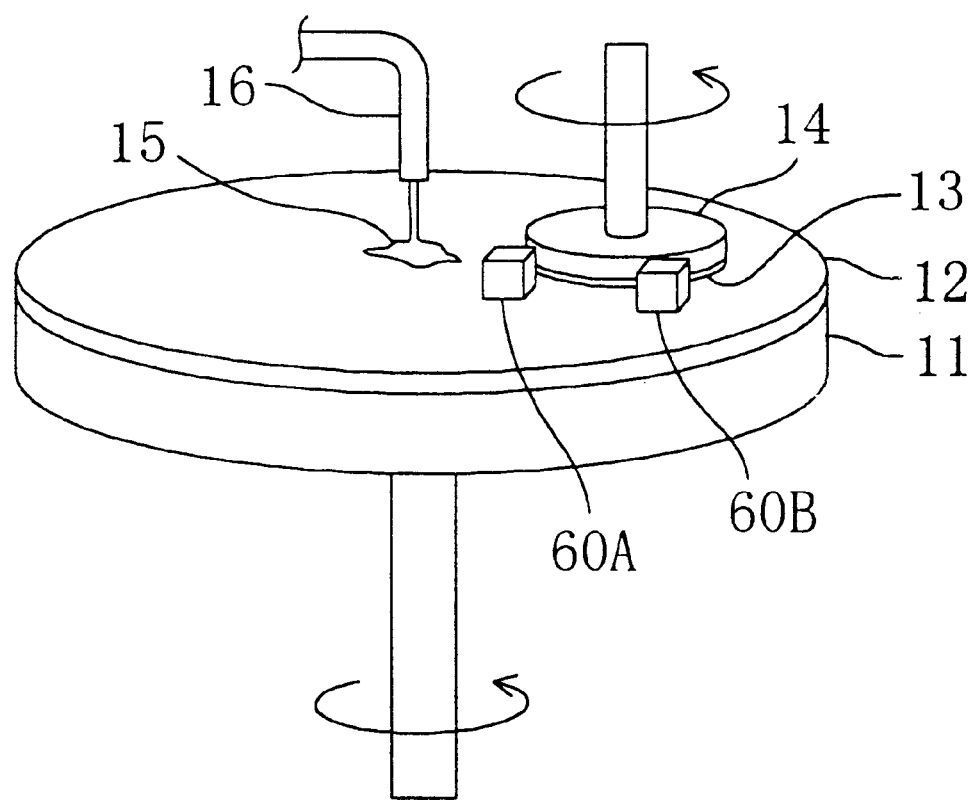
FIG. 17 is a perspective view of a polishing apparatus according to a fifth embodiment of the present invention.

FIG. 17 shows the schematic structure of the polishing apparatus according to the fifth embodiment. As shown in the drawing, a rotatable platen 11 composed of a flat rigid body has a polishing pad 12 adhered to the top surface thereof. A carrier 14 as substrate holding means for holding a substrate 13 as a substrate to be polished and a slurry supply pipe 16 for supplying an abrasive slurry 15 onto the polishing pad 12 are provided above the polishing pad 12.

The fifth embodiment is characterized in that two pressing solid members 60A and 60B each in the form of a rectangular parallelepiped are provided at respective locations above the polishing pad 12 and upstream of the carrier 14 in the direction of rotation of the platen 11 so as to locally press the surface of the polishing pad 12 and generate frictional heat. To apply pressure to the polishing pad 12 by means of the pressing solid members 60A and 60B, there may be used the method wherein each of the pressing solid members 60A and 60B produces a load by its own weight or the method wherein a load is produced by supplying pressing air from above.

Since the pressing solid members 60A and 60B are in direct contact with the surface of the polishing pad 12, the pressing solid members 60A and 60B are preferably composed of a material chemically unreactive with the abrasive slurry 15. As a material having resistance to an acid or alkali, there can be listed Teflon (polytetrafluoroethylene). At least the portions of the surfaces of the pressing solid members 60A and 60B in direct contact with the abrasive slurry 15 are preferably coated with Teflon. In this case, the coating layers of Teflon are preferably thick, since they are mechanically grated by abrasive grains contained in the abrasive slurry. Instead of Teflon, ceramic, diamond, or silicon may compose the coating layers formed on the surfaces of the pressing solid members 60A and 60B.

The pressing solid members 60A and 60B may also be composed of the same material as a target film to be polished deposited on the substrate 13 (e.g., a metal film of tungsten or the like and a silicon oxide film). The arrangement will not adversely affect the process of polishing the substrate 13, since a sufficient amount of heat is generated and dust resulting from grating is made of the same material as that generated from the substrate 13. In this case, the coating layer is preferably formed to have a sufficient thickness since the pressing solid members 60A and 60B are gradually polished by the polishing pad 12.

The varying surface temperature of the polishing pad 12 can be controlled with higher accuracy with the pressing solid members 60A and 60B smaller in size. However, a larger amount of frictional heat can be generated with the pressing solid members 60A and 60B larger in size. Hence, it is preferred to use the pressing solid members 60A and 60B in optimum size. The configurations of the pressing solid members 60A and 60B are not particularly limited.

Figure 18A:
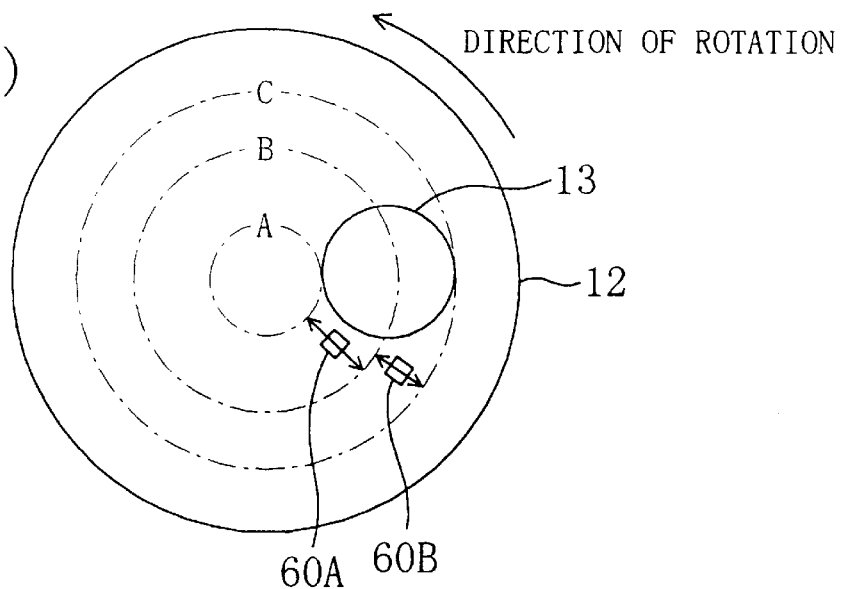
FIG. 18(a) is a plan view showing an example of the placement of a pressing solid member in the polishing apparatus according to the fifth embodiment and FIGS. 18(b) and 18(c) show different configurations of the bottom face of the pressing solid member of the polishing apparatus according to the fifth embodiment.
Figure 18B:
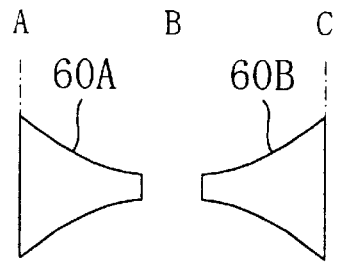
Figure 18C:
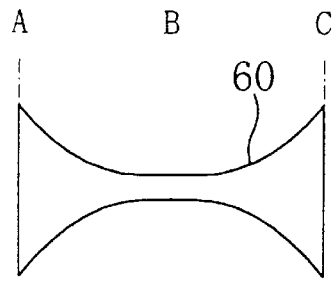

FIG. 18 shows an example of the placement of the pressing solid members 60A and 60B. As shown in the drawing, the pressing solid member 60A in the inner position is movable between the regions A and B in the radial direction of the polishing pad 12. The pressing solid member SOB in the outer position is movable between the regions B and C in the radial direction of the polishing pad 12. The pressing solid members 60A and 60B are positioned immediately upstream of the substrate 13 in the direction of rotation of the platen 11 so that the surface regions of the polishing pad 12 pressed by the pressing solid members 60A and 60B and thereby increased in temperature promptly reach the substrate 13 with the rotation of the platen 11.

As for the number of the pressing solid members 60A and 60B, it is not particularly limited. However, two, three, ore more high-temperature solid member are preferably provided, since it is difficult to control the temperature in a short period of time with only one high-temperature solid member.

The bottom configurations of the pressing solid members 60A and 60B are not particularly limited. However, they are preferably trapezoidal and arranged with their shorter sides facing each other, as shown in FIG. 18(*b*), because the arrangement elongates the time during which the portions in the vicinity of the regions A and C of the polishing pad 12 are under pressure, resulting in a rapid temperature increase in the vicinity of the regions A and C.

Alternatively, the inner pressing solid member 60A and the outer pressing solid member 60B may be formed integrally to provide a single pressing solid member 60 having an hourglass bottom configuration, as shown in FIG. 18(*c*). This allows the surface temperature of the polishing pad 12 to increase gradually and consistently from the region A to the region C.

Alternatively, the inner pressing solid member 60A and the outer pressing solid member 60B may be formed integrally to provide a single pressing solid member 60 having a circular bottom configuration. However, since the amount of heat generated around the center of the circle is increased disadvantageously, the bottom face of the pressing solid member 60 in contact with the polishing pad 12 is preferably formed with a circular opening smaller in diameter than the circular bottom face. In other words, the pressing solid member 60 has an annular bottom face. In this case, the inner and outer circumferences of the annular bottom face of the pressing solid member 60 are so determined as to reduce variations in the temperature of the polishing pad 12, since frictional heat increases with the increasing ratio of the length of an arc defined by the inner circumference of the annular bottom face of the pressing solid member 60*a* and partially composing a circle including a given point on the polishing pad 12 to the circumference of the entire circle. The pressing solid member 60 may be adapted to remain at rest or rotate.

(Variation of Fifth Embodiment)

A polishing apparatus according to a variation of the fifth embodiment of the present invention will be described with reference to the drawings.

Figure 19:
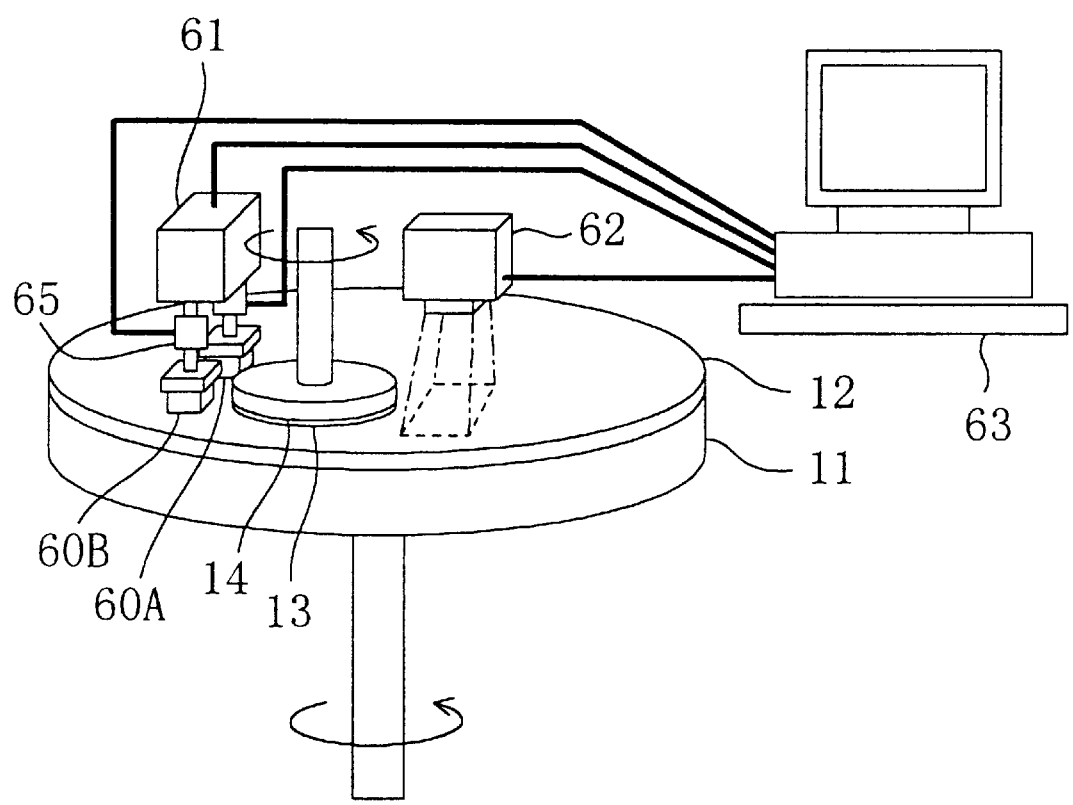
FIG. 19 is a perspective view of a polishing apparatus according to a variation of the fifth embodiment.

FIG. 19 shows the schematic structure of the polishing pad according to the variation of the fifth embodiment.

The variation of the fifth embodiment is characterized in that it comprises a pressing-solid-member control unit for automatically measuring the surface temperature of the polishing pad 12 in two dimensions and automatically controlling the application of pressure by the pressing solid members 60A and 60B based on the measured surface temperature. The pressing-solid-member control unit has: a driving unit 61 for driving the pressing solid members 60A and 60B in the vertical direction relative to the polishing pad 12 and in the radial direction of the polishing pad 12; a temperature measuring camera 62 for measuring the surface temperature of the polishing pad 12 in two dimensions without contact therewith; and a computer 63 for receiving a temperature signal from the temperature measuring camera 62 and operating the driving unit 61 based on the received temperature signal. In FIG. 19, the rectangle bordered by the broken lines indicates a region where the temperature measuring camera 62 measures the surface temperature of the polishing pad 12.

The driving unit 61 has: moving means for moving the pressing solid members 60A and 60B in the radial direction of the polishing pad 12; and a pressing air supply unit 65 for pressing the pressing solid members 60A and 60B against the polishing pad 12. The pressing air supply unit 65 is capable of adjusting the pressure exerted by the pressing solid members 60a and 60B on the surface of the polishing pad 12. To control the pressing air supplied to the pressing solid members 60A and 60B, for example, there can be used the method wherein the pressing air supplied to the pressing solid members 60a and 60B is reduced in pressure at the time when variations in the surface temperature of the polishing pad 12 are decreasing and the supply of the pressing air to the pressing solid members 60A and 60B is ceased at the time when the surface temperature of the polishing pad 12 becomes uniform.

Figure 20:
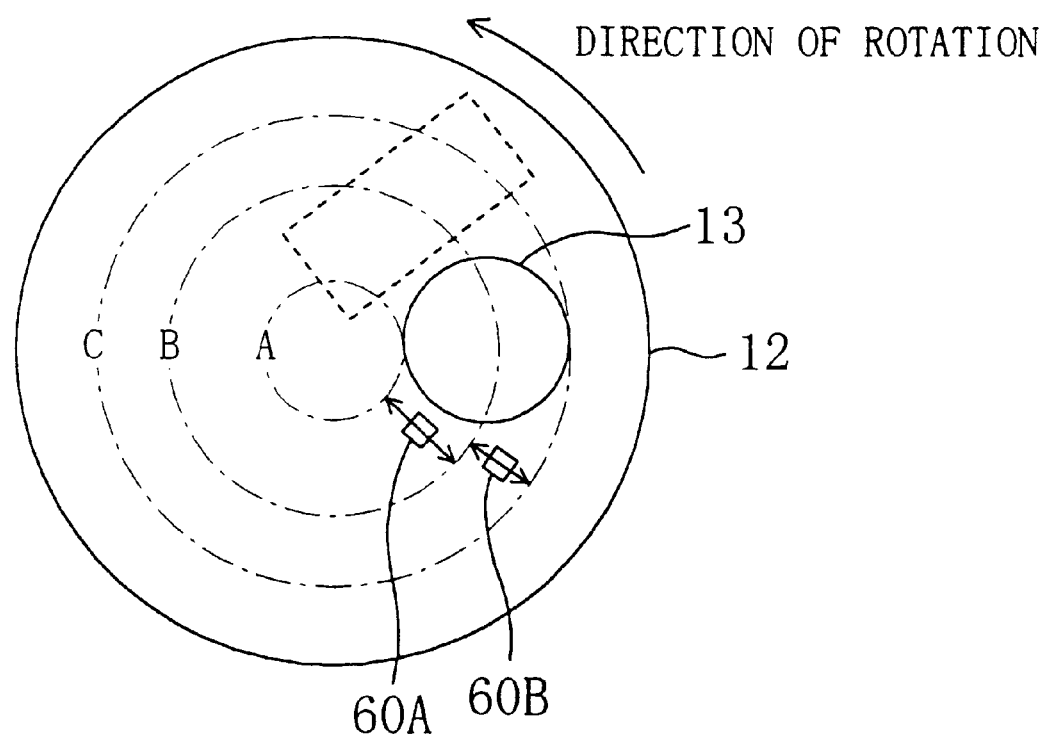
FIG. 20 is a plan view showing a region where a temperature measuring camera of the polishing apparatus according to the variation of the fifth embodiment measures temperature.

FIG. 20 shows the region where the temperature measuring camera 62 measures the temperature (indicated by the rectangle bordered by the broken lines). As shown in FIG. 20, the temperature measuring camera 62 measures the surface temperature in the region immediately downstream of the substrate 13 in the direction of rotation of the platen 11. This is because, after the polishing pad 12 passes through the substrate 13, the temperature thereof varies with time by the cooling action of the platen 11, abrasive slurry 15, or the like.

The surface temperature of the polishing pad 12 need not necessarily be measured in two dimensions provided that the surface temperature of the polishing pad 12 can be measured in the radial direction. For example, a plurality of radiation thermometers for one-point measurement (a sufficient number of radiation thermometers to detect the distribution of temperature variations) may be arranged in the radial direction of the polishing pad 12 so that the temperature (current) signal indicating the temperature measured by the radiation thermometers is outputted to the computer 63.

A description will be given to a polishing method implemented by using the polishing apparatus according to the fifth embodiment and the variation thereof.

First, the platen 11 is rotated and the carrier 14 is lowered in level to press the substrate 13 against the polishing pad 12, while the abrasive slurry 15 containing abrasive grains is supplied from the slurry supply pipe 16 onto the polishing pad 12, whereby a target surface of the substrate 13 is polished. To press the substrate 13 against the polishing pad 12, the backing pad pressing method or air pressing method discussed in the description of the prior art may be used appropriately.

In the polishing step, the target surface of the substrate 13 is polished by using the polishing apparatus according to the fifth embodiment shown in FIG. 17, while the region A (first region) and the region C (second region) each having a relatively low surface temperature during polishing are pressed by the pressing solid members 60A and 60B positioned in accordance with the example of placement shown in FIG. 18 and thereby increased in surface temperature with the resulting frictional heat. The pressing of the regions A and C by the pressing solid members 60A and 60B can be timed in accordance with the method wherein pressing is initiated simultaneously with the initiation of polishing and continued till the completion of polishing or the method wherein pressing is initiated prior to the initiation of polishing to previously increase the surface temperature in the regions A and C and continued till the completion of polishing. Since the methods can reduce variations in the surface temperature of the polishing pad 12, variations in the polishing speed of the substrate 13 are also reduced. In accordance with the latter method, in particular, variations in the surface temperature of the polishing pad 12 can further be reduced since the regions A and C of the polishing pad 12 have been preheated.

The polishing step may be performed by using the polishing apparatus according to the variation of the fifth embodiment shown in FIG. 19 instead of the polishing apparatus according to the fifth embodiment. In this case, the distribution of the surface temperature of the polishing pad 12 is measured in two dimensions by the temperature measuring camera 62 whenever as necessary or, alternatively, the surface temperature in the radial direction of the polishing pad 12 is measured by the plurality of radiation thermometers for one-point measurement arranged in the radial direction of the polishing pad 12, so that a drive signal based on the signal indicating the measured temperature is outputted from the computer 63 to the driving unit 61 to control the positioning of respective points to be pressed by the pressing solid members 60A and 60B and control the pressure applied thereto.

Although manual temperature measurement, manual positioning of the points to be pressed, and manual control of the pressure applied thereto can also be performed to provide a uniform temperature over the entire surface of the polishing pad 12 by means of the pressing solid members 60A and 60B, they are lacking in accuracy and unsuitable for mass production. By contrast, the use of the polishing apparatus according to the variation of the fifth embodiment to control the positioning of the points to be pressed by the pressing solid members 60A and 60B and control the pressure applied thereto by means of the pressing-solid-member control unit provides a uniform temperature over the entire surface of the polishing pad 12 promptly and accurately. In this case, if the measurement of the surface temperature of the polishing pad 12, the positioning of the points to be pressed by the pressing solid members 60A and 60B, and the control of the pressure applied thereto are repeatedly performed, the surface temperature of the entire polishing pad 12 becomes more uniform.

As described above, the positioning of the points to be pressed by the pressing solid members 60A and 60B and the pressure applied thereto have been controlled based on the assumption that the carrier 14 applies equal pressure to the substrate 13 to press it against the polishing pad 12 and the relative velocity of the substrate 13 is equal to that of the polishing pad 12. In the case where the pressure or polishing speed is not equal, the region of the polishing pad 12 corresponding to the portion of the substrate 13 polished at a lower speed is pressed so that variations in the polishing speed of the substrate 13 are reduced.

(Sixth Embodiment)

A sixth embodiment of the present invention will be described with reference to the drawings.

Figure 21:
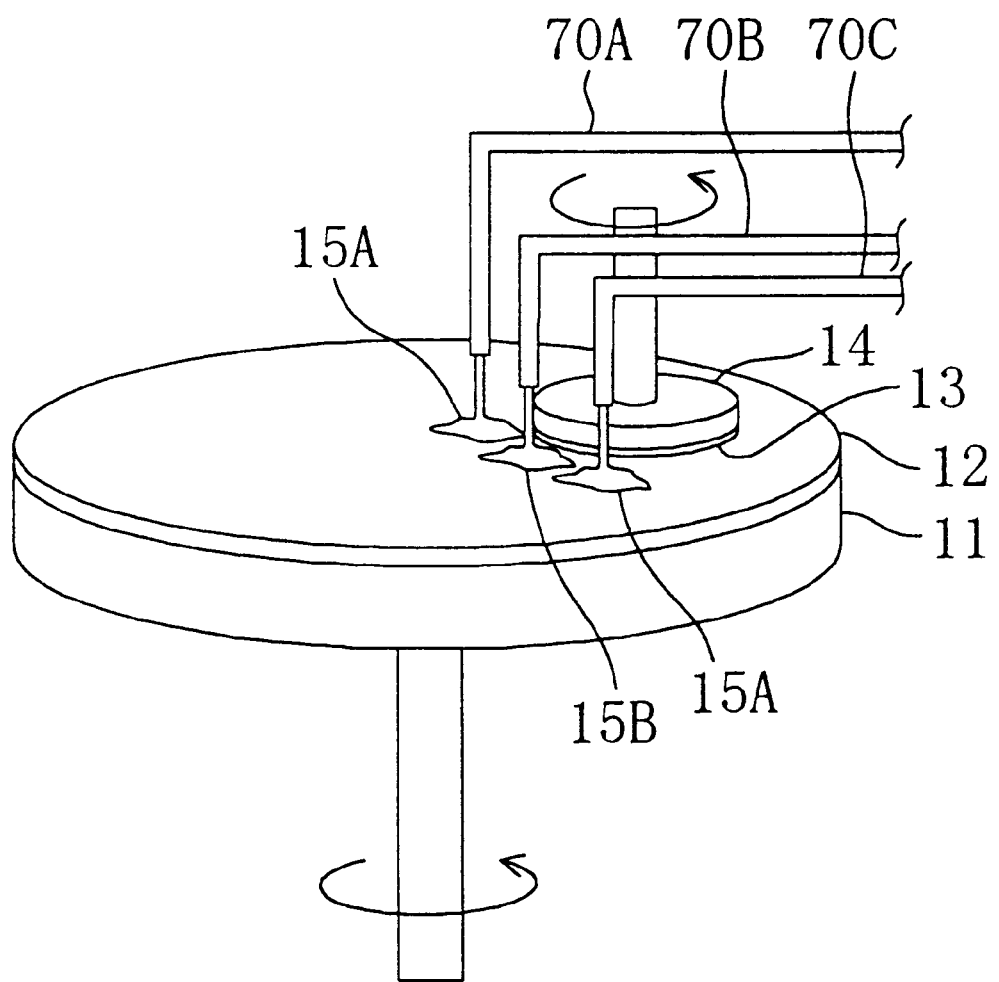
FIG. 21 is a perspective view of a polishing apparatus according to a sixth embodiment of the present invention.

FIG. 21 shows the schematic structure of the polishing apparatus according to the second embodiment. As shown in the drawing, a rotatable platen 11 composed of a flat rigid body has a polishing pad adhered to the top surface thereof. A carrier 14 as substrate holding means for holding a substrate 13 as a substrate to be polished is provided above the polishing pad 12.

The sixth embodiment is characterized in that high-temperature-slurry supply pipes 70A and 70C each for supplying a high-temperature abrasive slurry 15A and a low-temperature-slurry supply pipe 70B for supplying a low-temperature abrasive slurry are provided at respective locations above the platen 11 and upstream of the polishing pad 12 in the direction of rotation of the platen 11. The high-temperature-slurry supply pipes 70A and 70C are located above the inner and outer regions of the polishing pad 12, while the low-temperature-slurry supply pipe 70B is located in the midrange region thereof.

Figure 22:
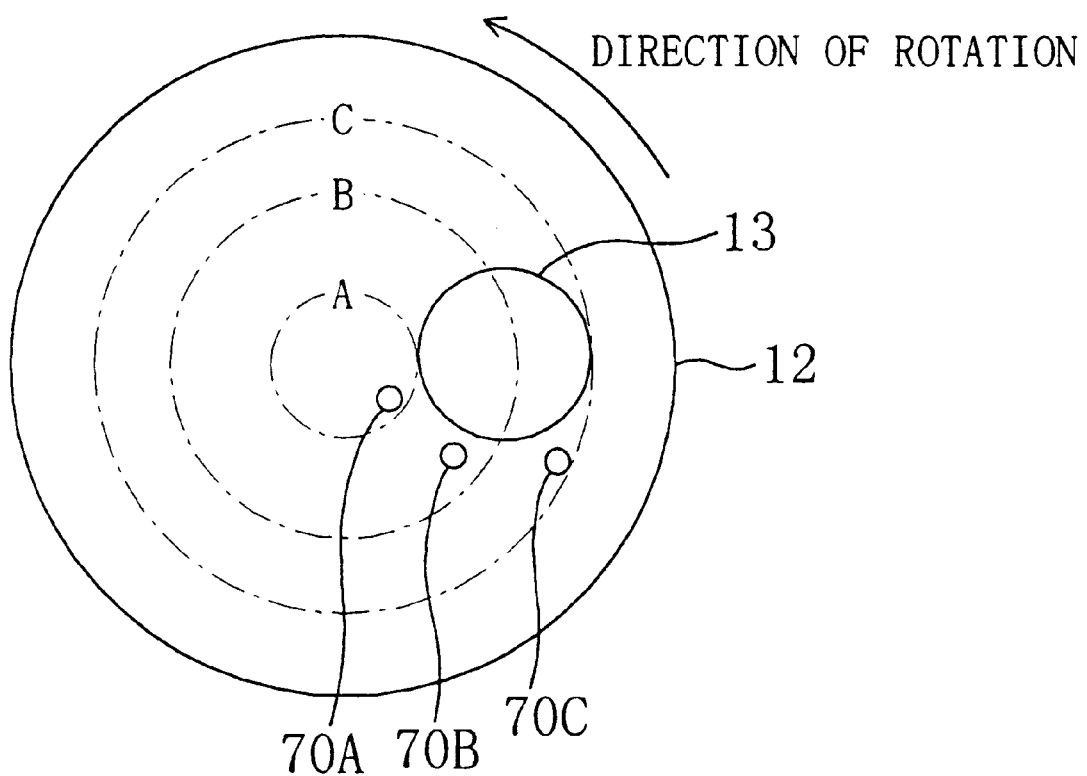
FIG. 22 is a plan view showing the respective placements of a high-temperature-slurry supply pipe and a low-temperature-slurry supply pipe in the polishing apparatus according to the sixth embodiment.

FIG. 22 shows an example of the placement of the high-temperature-slurry supply pipes 70A and 70C and the low-temperature-slurry supply pipe 70B. As shown in the drawing, the high-temperature-slurry supply pipes 70A and 70C are positioned so as to supply the high-temperature abrasive slurry 15A to respective regions slightly interior to a region A (first region) and a region C (second region) each having a relatively low surface temperature during polishing. On the other hand, the low-temperature-slurry supply pipe 70B is positioned so as to supply the low-temperature abrasive slurry 15B to a region slightly interior to a region B (third region) having a relatively high surface temperature during polishing. The high-temperature abrasive slurry and the low-temperature abrasive slurry are supplied to the respective regions slightly interior to the regions A and C and to the region slightly interior to the region B because the supplied abrasive slurries flow outwardly along the surface of the polishing pad 12 by a centrifugal force accompanying the rotation of the platen 11. By thus supplying the high-temperature slurry 15A to the regions A and C having a relatively low surface temperature and the low-temperature slurry 15B to the region B having a relatively high surface temperature, the surface temperature of the polishing pad 12 becomes uniform. In this case, the high-temperature abrasive slurry 15A supplied from the inner high-temperature-slurry supply pipe 70A flows into the region B, but it presents no particular problem since the temperature of the abrasive agent has already been lowered. Although it has been stated that the surface temperature of the polishing pad 12 becomes uniform, the temperature of the polishing pad 12 need not necessarily be uniform provided that at least the temperature of the abrasive slurry in contact with the substrate 13 is uniform.

The high-temperature-slurry supply pipes 70A and 70C and the low-temperature-slurry supply pipe 70B are positioned immediately upstream of the substrate in the direction of rotation of the platen 11 so that the surface regions of the polishing pad 12 heated by the high-temperature abrasive slurry 15A supplied from the high-temperature-slurry supply pipes 70A and 70C and the surface region of the polishing pad 12 cooled by the low-temperature abrasive slurry 15B supplied from the low-temperature-slurry supply pipe 70b swiftly reach the substrate 13 with the rotation of the platen 11.

The number of the high-temperature-slurry supply pipes 70A and 70C and the number of the low-temperature-slurry supply pipe 70B are not particularly limited. A larger number of high-temperature-slurry supply pipes and a larger number of low-temperature-slurry supply pipes than those shown in FIG. 22 may be provided.

Although the sixth embodiment has provided the total of three slurry supply pipes consisting of the high-temperature-slurry supply pipes 70A and 70C and the low-temperature-slurry supply pipe 70B, either the high-temperature-slurry supply pipe 70A or 70C or the low-temperature-slurry supply pipe 70B may be provided. Of the inner and outer high-temperature-slurry supply pipes 70A and 70C, either one may be provided. In the case of providing only the inner high-temperature-slurry supply pipe 70A, it presents no particular problem since the abrasive slurry 15A supplied therefrom flows outwardly along the surface of the polishing pad 12. In the case of providing only the outer high-temperature-slurry supply pipe 70C or the low-temperature-slurry supply pipe 70B, however, it is necessary to provide another slurry supply pipe for supplying an abrasive slurry to the center of the polishing pad 12, similarly to the first to fifth embodiments, since no abrasive slurry is supplied to the region located between the regions A and C.

Alternatively, the high-temperature-slurry supply pipes 70A and 70C and the low-temperature-slurry supply pipe 70B may be movable in the radial direction of the polishing pad 12.

(Variation of Sixth Embodiment)

A polishing apparatus according to a variation of the sixth embodiment of the present invention will be described with reference to the drawings.

Figure 23:
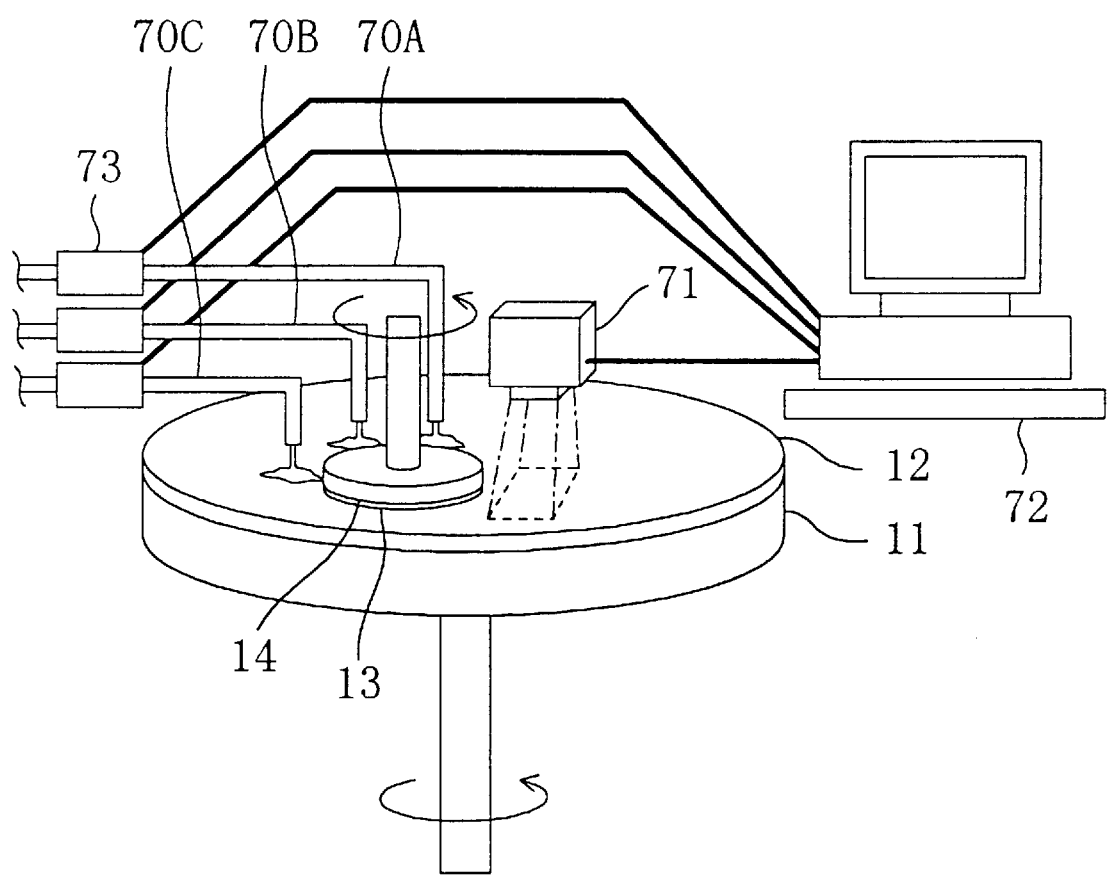
FIG. 23 is a perspective view of a polishing apparatus according to a variation of the sixth embodiment.

FIG. 23 shows the schematic structure of the polishing pad according to the variation of the sixth embodiment.

The variation of the sixth embodiment is characterized in that it comprises a slurry-supply-pipe control unit for automatically measuring the surface temperature of the polishing pad 12 in two dimensions and automatically controlling the amount of the high-temperature abrasive slurry 15A supplied from the high-temperature-slurry supply pipes 70A and 70C as well as the amount of the low-temperature abrasive slurry 15B supplied from the low-temperature-slurry supply pipe 70B. The slurry-supply-pipe control unit has: a temperature measuring camera 71 for measuring the surface temperature of the polishing pad 12 in two dimensions without contact therewith; a computer 72 for receiving a temperature signal from the temperature measuring camera 71 and outputting a flow rate signal based on the received temperature signal; and a flow-rate regulating valve 73 for regulating the amount of the abrasive slurry supplied to the respective high-temperature-slurry supply pipes 70A and 70C and the amount of the abrasive slurry supplied to the low-temperature-slurry supply pipe 70B. In FIG. 23, the rectangle bordered by the broken lines indicates a region where the temperature measuring camera 71 measures the surface temperature of the polishing pad 12.

Figure 24:
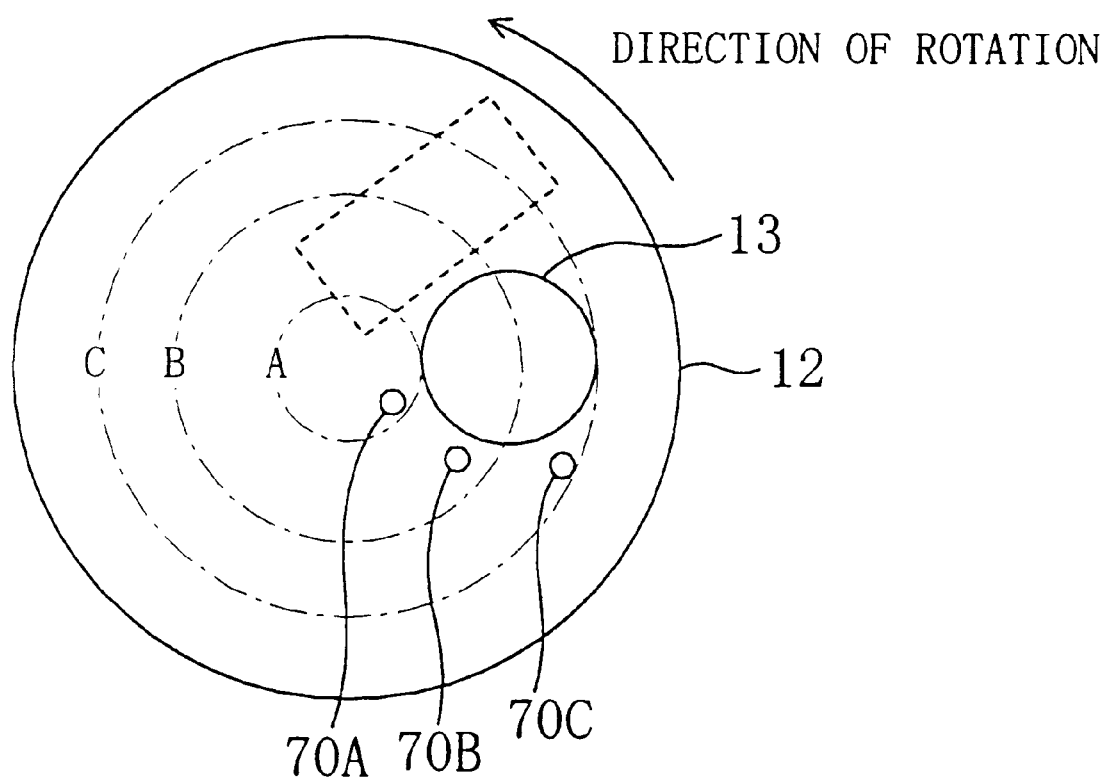
FIG. 24 is a plan view showing a region where a temperature measuring camera of the polishing apparatus according to the variation of the sixth embodiment measures temperature.
Figure 25:
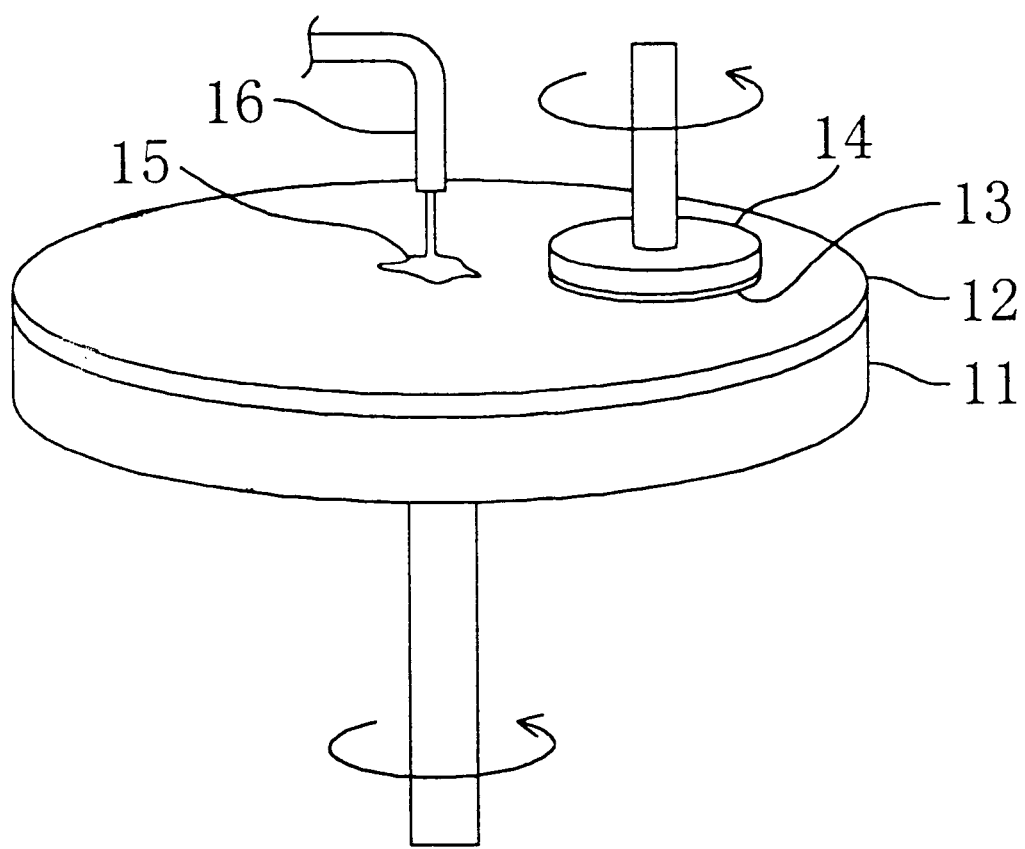
FIG. 25 is a perspective view of a conventional polishing apparatus.
Figure 26:
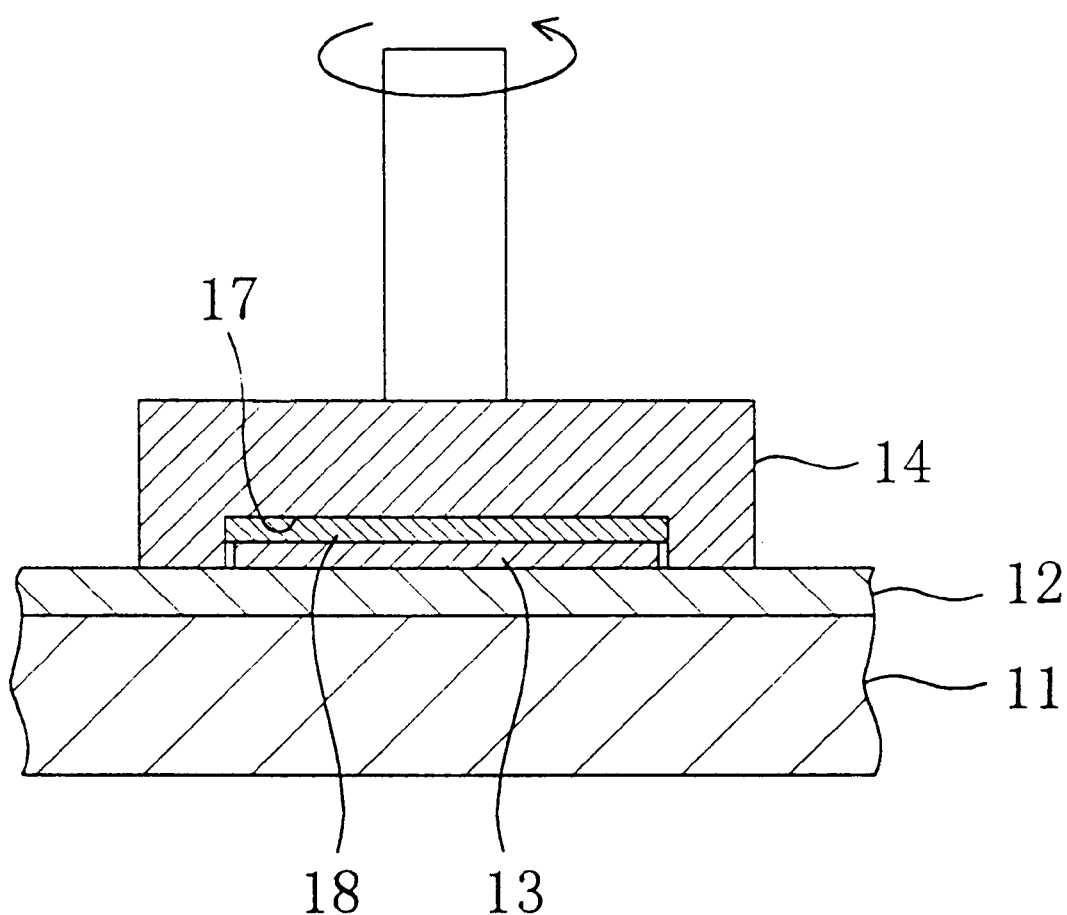
FIG. 26 is a cross-sectional view illustrating a first method of pressing a substrate against a polishing pad in the conventional polishing apparatus.
Figure 27:
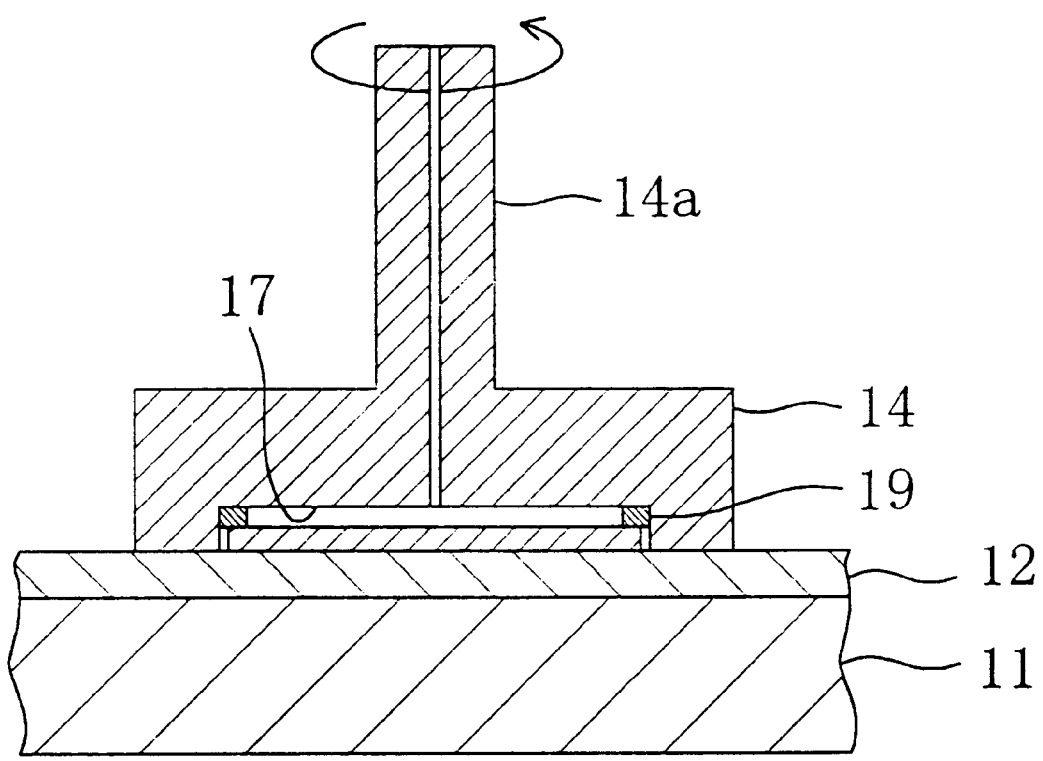
FIG. 27 is a cross-sectional view illustrating a second method of pressing the substrate against the polishing pad in the conventional polishing apparatus.
Figure 28A:
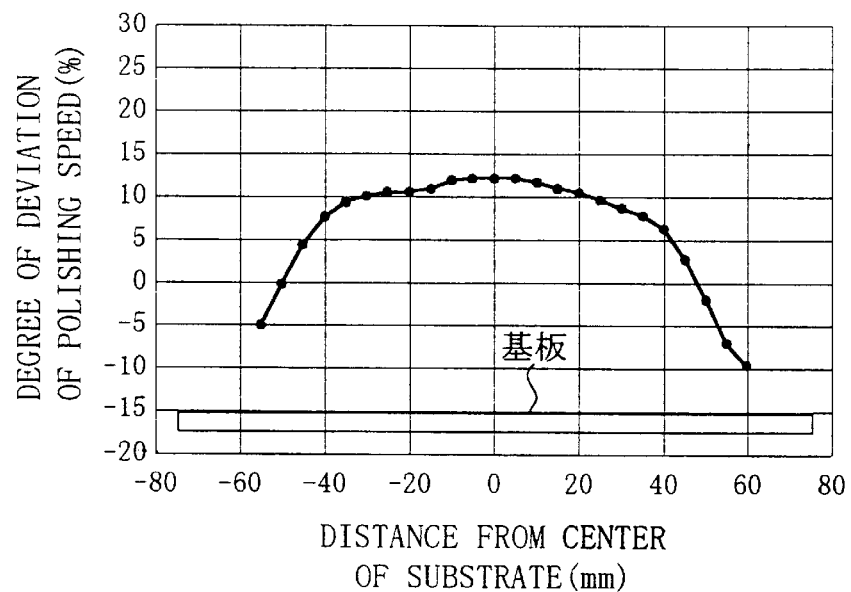
FIG. 28(a) is a graph showing the relationship between the distance from the center of a target surface of the substrate to be polished and the degree of deviation in polishing speed and FIG. 28 (b) shows the relationship between the distance from the center of rotation of the polishing pad and a difference in surface temperature on the polishing pad.
Figure 28B:
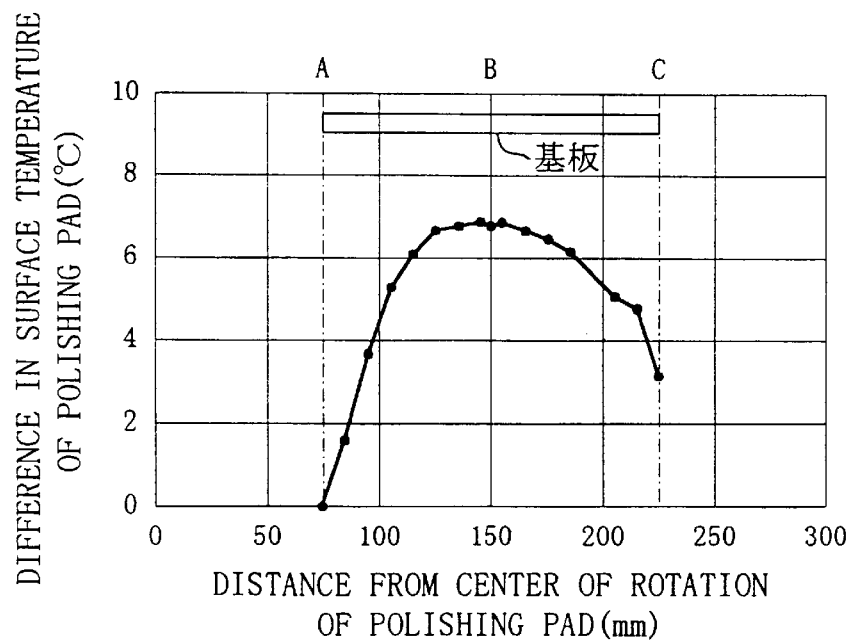

FIG. 24 shows the region where the temperature measuring camera 71 measures the temperature (indicated by the rectangle bordered by the broken lines). As shown in FIG. 24, the temperature measuring camera 71 measures the surface temperature in the region immediately downstream of the substrate 13 in the direction of rotation of the platen 11. This is because, after the polishing pad 12 passes through the substrate 13, the surface temperature thereof varies with time by the cooling action of the platen 11, abrasive slurry 15, or the like.

The surface temperature of the polishing pad 12 need not necessarily be measured in two dimensions provided that the surface temperature of the polishing pad 12 can be measured in the radial direction. For example, a plurality of radiation thermometers for one-point measurement (a sufficient number of radiation thermometers to detect the distribution of temperature variations) may be arranged in the radial direction of the polishing pad 12 so that the temperature (current) signal indicating the temperature measured by the radiation thermometers is outputted to the computer 72.

The slurry-supply-pipe control unit may also be provided with additional temperature adjusting means for adjusting the temperature of the high-temperature abrasive slurry 15A supplied to the high-temperature slurry supply pipes 70A and 70C and the temperature of the low-temperature abrasive slurry 15B supplied to the low-temperature-slurry supply pipe 70B or with additional moving means for moving the high-temperature-slurry supply pipes 70A and 70C and the low-temperature-slurry supply pipe 70B in the radial direction of the polishing pad 12.

A description will be given to a polishing method implemented by using the polishing apparatus according to the sixth embodiment and the variation thereof.

First, the platen 11 is rotated and the carrier 14 is lowered in level to press the substrate 13 against the polishing pad 12, while the high-temperature abrasive slurry 15A from the high-temperature-slurry supply pipes 70A and 70C and the low-temperature abrasive slurry 15B from the low-temperature-slurry supply pipe 70B are supplied onto the polishing pad 12, whereby a target surface of the substrate 13 is polished. To press the substrate 13 against the polishing pad 12, the backing pad pressing method or air pressing method discussed in the description of the prior art may be used appropriately.

In the arrangement, the high-temperature abrasive slurry 15A supplied from the inner high-temperature-slurry supply pipe 70A flows toward the region B with the rotation of the platen 11, while increasing the temperature of the polishing pad 12 in the region A and reducing its own temperature. Accordingly, the surface temperature of the polishing pad 12 is increased to the greatest degree in the region A and to gradually smaller degrees toward the region B. On the other hand, the low-temperature abrasive slurry 15B supplied from the low-temperature-slurry supply pipe 70B flows toward the region C with the rotation of the platen 11, while reducing the temperature of the polishing pad 12 in the region B and increasing its own temperature. Accordingly, the surface temperature of the polishing pad 12 is reduced to the greatest degree in the region B and to gradually smaller degrees toward the region C. By contrast, the high-temperature abrasive slurry 15A supplied from the outer high-temperature-slurry supply pipe 70C flows toward the periphery of the polishing pad 12 with the rotation of the platen 11, while increasing the temperature of the polishing pad 12 in the region C and reducing its own temperature. Accordingly, the surface temperature of the polishing pad 12 is increased in the region C. As a result, variations in the surface temperature of the polishing pad 12 are reduced.

Although the high-temperature abrasive slurry 15A may be supplied either one of the inner and outer high-temperature-slurry supply pipes 70A and 70C, the effect of reducing variations in the surface temperature of the polishing pad 12 is slightly reduced in that case. In the case of supplying the high-temperature abrasive slurry 15A only from the outer high-temperature-slurry supply pipe 70C, it is necessary to supply the abrasive slurry to the center of the polishing pad 12, as described above. Alternatively, only the low-temperature abrasive slurry 15B may be supplied from the low-temperature-slurry supply pipe 70B without supplying the high-temperature abrasive slurry 15A from the high-temperature-slurry supply pipes 70A and 70C. In that case also, however, the effect of reducing variations in the surface temperature of the polishing pad 12 is reduced and the abrasive slurry should be supplied to the center of the polishing pad 12.

It is also possible to preliminarily supply the high-temperature abrasive slurry 15A from the high-temperature-slurry supply pipes 70A and 70C and the low-temperature abrasive slurry 15B from the low-temperature-slurry supply pipe 70B prior to polishing and then initiate polishing after the temperature of the polishing pad 12 is increased in the regions A and C and reduced in the region B. The arrangement permits the substrate 13 to be polished at a more uniform speed.

The polishing step may be performed by using the polishing apparatus according to the variation of the sixth embodiment shown in FIG. 23 instead of the polishing apparatus according to the sixth embodiment. In this case, the distribution of the surface temperature of the polishing pad 12 is measured in two dimensions by the temperature measuring camera 71 whenever necessary or, alternatively, the surface temperature in the radial direction of the polishing pad 12 is measured by the plurality of radiation thermometers for one-point measurement arranged in the radial direction of the polishing pad 12, so that a flow rate signal based on the signal indicating the measured temperature is outputted from the computer 72 to the flow-rate regulating valve 73 to regulate the flow rate of the high-temperature abrasive slurry supplied from the high-temperature-slurry supply pipes 70A and 70C and the flow rate of the low-temperature abrasive slurry supplied from the low-temperature-slurry supply pipe 70B such that the surface temperature of the polishing pad 12 becomes uniform. The arrangement renders the surface temperature of the polishing pad 12 excellently uniform and permits the substrate 13 to be polished at a more uniform speed. In this case, if the measurement of the surface temperature of the polishing pad 12 and the control of the flow rate of the high-temperature abrasive slurry supplied from the high-temperature-slurry supply pipes 70A and 70C as well as the flow rate of the low-temperature abrasive slurry supplied from the low-temperature-slurry supply pipe 70B are repeatedly performed, the surface temperature becomes more uniform over the entire polishing pad 12.

Although manual temperature measurement and manual control of the flow rates can also be performed to provide a uniform temperature over the entire surface of the polishing pad 12 by means of the high-temperature-slurry supply pipes 70A and 70C and the low-temperature-slurry supply pipe 70B, they are lacking in accuracy and therefore unsuitable for mass production. By contrast, the use of the polishing apparatus according to the variation of the sixth embodiment to control the flow rate of the high-temperature abrasive slurry supplied from the high-temperature-slurry supply pipes 70A and 70C and the flow rate of the low-temperature abrasive slurry supplied from the low-temperature-slurry supply pipe 70B provides a uniform temperature over the entire surface of the polishing pad 12 promptly and accurately.

Instead of changing the flow rate of the high-temperature abrasive slurry supplied from the high-temperature-slurry supply pipes 70A and 70C and the flow rate of the low-temperature abrasive slurry supplied from the low-temperature-slurry supply pipe 70B, the surface temperature of the polishing pad 12 may be controlled by changing the temperature of the high-temperature abrasive slurry supplied from the high-temperature-slurry supply pipes 70A and 70C or the temperature of the low-temperature abrasive slurry supplied from the low-temperature-slurry supply pipe 70B or by changing the positions at which the high-temperature-slurry supply pipes 70A and 70C supply the high-temperature abrasive slurry or the position at which the low-temperature-slurry supply pipe 70B supplies the low-temperature abrasive slurry.

As described above, the flow rate of the high-temperature abrasive slurry supplied from the high-temperature-slurry supply pipes 70A and 70C and the flow rate of the low-temperature abrasive slurry supplied from the low-temperature-slurry supply pipe 70B have been controlled based on the assumption that the carrier 14 applies equal pressure to the substrate 13 to press it against the polishing pad 12 and the relative velocity of the substrate 13 is equal to that of the polishing pad 12. In the case where the pressure or polishing speed is not equal, the high-temperature abrasive slurry is supplied to the region of the polishing pad 12 corresponding to the portion of the substrate 13 polished at a lower speed and the low-temperature abrasive slurry is supplied to the region of the polishing pad 12 corresponding to the portion of the substrate 13 polished at a high speed so that variations in the polishing speed of the substrate 13 are reduced.

We claim:

1. A polishing method comprising:

polishing a target surface of a substrate to be polished by pressing said substrate against a surface of a polishing pad fixed on a rotating platen, while supplying an abrasive slurry onto said polishing pad, said method further comprising:

a polishing pad heating step of heating, of a contact area included in the surface of said polishing pad and brought into contact with said target surface with the rotation of said polishing pad to polish said target surface, a specified region in contact with a portion of said target surface being polished at a low speed relative to another portion of said target surface.

2. A polishing method comprising:

polishing a target surface of a substrate to be polished by pressing said substrate against a surface of a polishing pad fixed on a rotating platen, while supplying an abrasive slurry onto said polishing pad, said method further comprising:

a polishing pad heating step of heating, of a contact area included in the surface of said polishing pad and brought into contact with said target surface with the rotation of said polishing pad to polish said target surface, a specified region which is at least one of a first region closer to a center of rotation of said polishing pad than a central axis of said target surface and a second region farther away from the center of rotation of said polishing pad than a central axis of said target surface.

3. A polishing method comprising:

polishing a target surface of a substrate to be polished by pressing said substrate against a surface of a polishing pad fixed on a rotating platen, while supplying an abrasive slurry onto said polishing pad, said method further comprising:

a polishing pad heating step of measuring a surface temperature of a contact area included in the surface of said polishing pad and brought into contact with said target surface with the rotation of said polishing pad to polish said target surface and heating a specified region of said contact area having a low surface temperature relative to another region of said contact area.

4. A polishing method according to any one of claims 1 to 3, wherein said polishing pad heating step includes the step of irradiating said specified region with light, an electromagnetic wave, or a laser beam and thereby heating said specified region.

5. A polishing method according to any one of claims 1 to 3, wherein said polishing pad heating step includes the step of spraying high-temperature gas onto said specified region and thereby heating said specified region.

6. A polishing method according to any one of claims 1 to 3, wherein said polishing pad heating step includes the step of bringing a high-temperature solid member into contact with said specified region and thereby heating said specified region.

7. A polishing method according to any one of claims 1 to 3, wherein said polishing pad heating step includes the step of pressing a pressing solid member against said specified region to generate frictional heat and thereby heating said specified region.

8. A polishing method according to any one of claims 1 to 3, wherein said polishing pad heating step includes the step of supplying a high-temperature abrasive slurry to said specified region and thereby heating said specified region.

9. A polishing method comprising:

polishing a target surface of a substrate to be polished by pressing said substrate against a surface of a polishing pad fixed on a rotating platen, while supplying an abrasive slurry onto said polishing pad, said method further comprising:

a polishing pad cooling step of cooling, of a contact area included in the surface of said polishing pad and brought into contact with said target surface with the rotation of said polishing pad to polish said target surface, a specified region in contact with a portion of said target surface being polished at a high speed relative to another portion of said target surface.

10. A polishing method comprising polishing:

polishing a target surface of a substrate to be polished by pressing said substrate against a surface of a polishing pad fixed on a rotating platen, while supplying an abrasive slurry onto said polishing pad, said method further comprising:

a polishing pad cooling step of cooling, of a contact area included in the surface of said polishing pad and brought into contact with said target surface with the rotation of said polishing pad to polish said target surface, a third region located between a first region closer to a center of rotation of said polishing pad than a central axis of said target surface and a second region farther away from the center of rotation of said polishing pad than a central axis of said target surface.

11. A polishing method comprising:

polishing a target surface of a substrate to be polished by pressing said substrate against a surface of a polishing pad fixed on a rotating platen, while supplying an abrasive slurry onto said polishing pad, said method further comprising:

a polishing pad cooling step of measuring a surface temperature of a contact area included in the surface of said polishing pad and brought into contact with said target surface with the rotation of said polishing pad to polish said target surface and cooling a region of said contact area having a high surface temperature relative to another region of said contact area.

12. A polishing apparatus comprising:

a rotatable platen;

a polishing pad fixed on said platen;

a slurry supply pipe for supplying an abrasive slurry onto said polishing pad;

substrate holding means for holding a substrate to be polished such that said substrate is movable toward and away from the polishing pad with a target surface of said substrate being opposed to a surface of said polishing pad; and polishing pad heating means for heating only a specified region of a contact area included in the surface of said polishing pad and brought in contact with said target surface with the rotation of said polishing pad, said specified region being in contact with a portion of said target surface being polished at a low speed relative to another portion of said target surface.

13. A polishing apparatus comprising:

a rotatable platen;

a polishing pad fixed on said platen;

a slurry supply pipe for supplying an abrasive slurry onto said polishing pad;

substrate holding means for holding a substrate to be polished such that said substrate is movable toward and away from said polishing pad with a target surface of said substrate being opposed to a surface of said polishing pad; and polishing pad heating means for heating only a specified region of a contact area included in the surface of said polishing pad and brought in contact with said target surface with the rotation of said polishing pad, said specified region being at least one of a first region closer to a center of rotation of said polishing pad than a central axis of said target surface and a second region farther away from the center of rotation of said polishing pad than a central axis of said target surface.

14. A polishing apparatus comprising:

a rotatable platen;

a polishing pad fixed on said platen;

a slurry supply pipe for supplying an abrasive slurry onto said polishing pad;

substrate holding means for holding a substrate to be polished such that said substrate is movable toward and away from said polishing pad with a target surface of said substrate being opposed to a surface of said polishing pad;

temperature measuring means for measuring a surface temperature of a contact area included in the surface of said polishing pad and brought into contact with said target surface with the rotation of said polishing pad; and polishing pad heating means for heating only a specified region of said contact area in which the surface temperature of said polishing pad measured by said temperature measuring means is low relative to another region of said contact area.

15. A polishing apparatus according to any one of claims 12 to 14, wherein said polishing pad heating means includes a plurality of polishing pad heating means arranged in a radial direction of said polishing pad.

16. A polishing apparatus according to any one of claims 12 to 14, wherein said polishing pad heating means is movable in a radial direction of said polishing pad.

17. A polishing apparatus according to any one of claims 12 to 14, wherein said polishing pad heating means heats a region of the contact area of said polishing pad to be subsequently brought in contact with said target surface with the rotation of said polishing pad.

18. A polishing apparatus according to any one of claims 12 to 14, wherein said polishing pad heating means is energy supplying means for supplying energy composed of light, an electromagnetic wave, or a laser beam to said specified region.

19. A polishing apparatus according to any one of claims 12 to 14, wherein said polishing pad heating means is high-temperature-gas spraying means for spraying high-temperature gas onto said specified region.

20. A polishing apparatus according to any one of claims 12 to 14, wherein said polishing pad heating means is high-temperature-solid-member contacting means for bringing a high-temperature solid member into contact with said specified region.

21. A polishing apparatus according to claim 20, wherein said high-temperature solid member is composed of metal and a surface portion of said high-temperature solid member in direct contact with said polishing pad is formed with a coating layer composed of polytetrafluoroethylene.

22. A polishing apparatus according to any one of claims 12 to 14, wherein said polishing pad heating means is pressing-solid-member pressing means for pressing a pressing solid member against said specified region and thereby generating frictional heat.

23. A polishing apparatus according to claim 22, wherein said pressing-solid-member pressing means presses said pressing solid member against said specified region by using a pressing fluid.

24. A polishing apparatus according to claim 22, wherein a surface portion of said pressing solid member in direct contact with said polishing pad is formed with a coating layer composed of polytetrafluoroethylene.

25. A polishing apparatus according to claim 22, wherein a portion of said pressing solid member in direct contact with said polishing pad is formed of the same material as a target film to be polished deposited on said substrate.

26. A polishing apparatus according to any one of claims 12 to 14, wherein said polishing pad heating means is high-temperature-slurry supplying means for supplying a high-temperature abrasive slurry from said slurry supply pipe to said specified region.

27. A polishing apparatus according to claim 14, further comprising a heating means control unit for reducing the degree of heating by said polishing pad heating means when the surface temperature of said polishing pad measured by said temperature measuring means is tending to increase, while increasing the degree of heating by said polishing pad heating means when the surface temperature of said polishing pad measured by said temperature measuring means is tending to decrease.

28. A polishing apparatus comprising:

a rotatable platen;

a polishing pad fixed on said platen;

a slurry supply pipe for supplying an abrasive slurry onto said polishing pad;

substrate holding means for holding a substrate to be polished such that said substrate is movable toward and away from said polishing pad with a target surface of said substrate being opposed to a surface of said polishing pad; and polishing pad cooling means for cooling only a specified region of a contact area included in the surface of said polishing pad and brought in contact with said target surface with the rotation of said polishing pad, said specified region being in contact with a portion of said target surface being polished at a high speed relative to another portion of said target surface.

29. A polishing apparatus comprising:

a rotatable platen;

a polishing pad fixed on said platen;

a slurry supply pipe for supplying an abrasive slurry onto said polishing pad;

substrate holding means for holding a substrate to be polished such that said substrate is movable toward and away from said polishing pad with a target surface of said substrate being opposed to a surface of said polishing pad; and polishing pad cooling means for cooling only a specified region of a contact area included in the surface of said polishing pad and brought in contact with said target surface with the rotation of said polishing pad, said specified region being a third region located between a first region closer to a center of rotation of said polishing pad than a central axis of said target surface and a second region farther away from the center of rotation of said polishing pad than a central axis of said target surface.

30. A polishing apparatus comprising:

a rotatable platen;

a polishing pad fixed on said platen;

a slurry supply pipe for supplying an abrasive slurry onto said polishing pad;

substrate holding means for holding a substrate to be polished such that said substrate is movable toward and away from said polishing pad with a target surface of said substrate being opposed to a surface of said polishing pad;

temperature measuring means for measuring a surface temperature of a contact area included in the surface of said polishing pad and brought into contact with said target surface with the rotation of said polishing pad; and polishing pad cooling means for cooling only a specified region of said contact area in which the surface temperature of said polishing pad measured by said temperature measuring means is high relative to another region of said contact area.

31. A polishing apparatus according to claim 14 or 30, wherein said temperature measuring means is a plurality of radiation thermometers arranged in a radial direction of said polishing pad, each of said radiation thermometers measuring the surface temperature at a point on said polishing pad without contact therewith.

32. A polishing apparatus according to claim 14 or 30, wherein said temperature measuring means measures the surface temperature of a region of the contact area of said polishing pad to be subsequently brought in contact with said target surface with the rotation of said polishing pad.

* * * * *